US006333133B1

(12) United States Patent
Nakamura et al.

(10) Patent No.: US 6,333,133 B1
(45) Date of Patent: Dec. 25, 2001

(54) POSITIVE PLANOGRAPHIC PRINTING MATERIAL

(75) Inventors: Ippei Nakamura; Kazuto Kunita, both of Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 09/503,345

(22) Filed: Feb. 14, 2000

(30) Foreign Application Priority Data

Feb. 15, 1999 (JP) ........................................ 11-036074
Oct. 7, 1999 (JP) ........................................ 11-286658

(51) Int. Cl.[7] .............................. G03C 1/73; G03C 5/16; G03F 7/038; G03F 7/30

(52) U.S. Cl. ....................... 430/270.1; 430/927; 430/944; 430/905; 430/906; 430/909; 430/910; 430/302; 430/326; 430/330

(58) Field of Search ................................ 430/270.1, 909, 430/910, 906, 944, 927, 302, 326, 330, 905

(56) References Cited

U.S. PATENT DOCUMENTS 3,951,328 * 4/1976 Wallace et al. ...................... 228/207
4,708,925 11/1987 Newman ........................... 430/270.1
5,952,106 * 9/1999 Schriver et al. .................. 428/423.5
6,074,802 * 6/2000 Murata et al. .................... 430/270.1
6,140,008 * 10/2000 Hsieh et al. ...................... 430/271.1
6,152,036 * 11/2000 Verschueren et al. ............... 101/457

FOREIGN PATENT DOCUMENTS

0755803A1 1/1997 (EP) .
0802067A1 10/1997 (EP) .
0819985A1 1/1998 (EP) .
0913253A1 5/1999 (EP) .
0913253 A1 * 5/1999 (EP) .
60-175046 9/1985 (JP) .
WO 99/02343 1/1999 (WO) .

OTHER PUBLICATIONS

Yosef et al Chemical Abstract 1998: 682196—abstract For WO 9843823 Published Oct. 8, 1998 (p. 27–29).*
Oie et al JPO abstract JP403107161 A—English abstract for JP 03107161 A Published on May 7, 1991.*

* cited by examiner

*Primary Examiner*—Janet Baxter
*Assistant Examiner*—Sin J. Lee
(74) *Attorney, Agent, or Firm*—Burns, Doane, Swecker & Mathis, LLP

(57) ABSTRACT

A positive planographic printing material which is capable of recording a digital data from a computer and the like, using a solid laser or a semiconductor laser emitting infrared rays. The positive planographic printing material comprises at least the following components (A) to (C):

(A) a polyfunctional amine compound, (B) a polymer which is water-insoluble and aqueous alkali solution-soluble and (C) an infrared absorber.

21 Claims, No Drawings

POSITIVE PLANOGRAPHIC PRINTING MATERIAL

BACKGROUND OF THE INVENTION

1. Field of the Invention

The present invention relates broadly to positive planographic printing materials having sensitivity in the infrared wavelength range, and particularly, to positive planographic printing materials which are capable of being used for what is known as "direct plate making" using an infrared laser based on digital signals outputted from a computer or the like.

2. Description of Related Art

There have been remarkable developments in lasers in recent years. In particular solid lasers or semiconductor lasers emitting infrared rays having wavelengths of 760 to 1200 nm (herein after sometimes referred to as "infrared laser"), and having a compact size and high output are now readily available. These infrared lasers are very useful as a recording light source when making a direct printing plate based on digital signals outputted from a computer or the like. Therefore, recent years have seen an increasing desire for an image recording material having high sensitivity to the above types of infrared ray recording light sources, namely, an image recording material in which a photochemical reaction and the like occurs upon irradiation with infrared rays and solubility in a developing solution varies significantly.

An image recording material of this type which can be recorded on by an infrared laser is the recording material constituted of onium salts, phenol resins and spectral sensitizers described in U.S. Pat. No. 4,708,925. This image recording material is a positive image recording material utilizing the effect manifested by a onium salt and a phenol resin of suppressing the dissolution of the image recording material in a developing solution.

It is difficult to cause photoreaction and the like in a compound wherein the solubility of an image recording material in a developing solution varies significantly by exposure with an infrared ray since the infrared ray has less energy than the ultraviolet ray conventionally used as a light source for exposure. For example, International Publication (WO) No. 97/39894 discloses an image recording material composed of an infrared absorber and a binder polymer soluble in an aqueous alkaline solution. In this image recording material, there is excellent positive action (development is suppressed in unexposed portions, but the development-suppression disappears in exposed portions) occurring as a result of light-to-heat conversion on the surface of the material irradiated with a laser, however, heat generated near the surface does not reach sufficiently deep into the material and positive action in deep portions is insufficient. As a result, even if alkaline development is conducted, discrimination between unexposed portions and exposed portions is not easily made clearly and sensitivity and development latitude are problematical.

Further, Japanese Patent Application Laid-open (JP-A) No. 7-20629 proposes an example in which a diazonium salt having a high level of heat decomposability is added as light/heat decomposable substance. This sensitive material has improved sensitivity and development latitude with regard to an infrared ray laser, however, it has poor storage stability such that the sensitivity decrease with time and is also problematical with regard to product management and the like.

As a result of intensive research into the constituent components of a positive planographic printing material capable of directly making a printing plate by the irradiation thereof with an infrared ray, the present inventors have found the following facts. When a polyfunctional amine compound is used together with a polymer which is water-insoluble but soluble in an aqueous alkaline solution (hereinafter, may be referred to simply as "aqueous alkali solution-soluble polymer"), the above-described polyfunctional amine compound causes a strong interaction with an alkali-soluble group in the above-described aqueous alkali solution-soluble polymer. Consequently, the film structure of a photosensitive film containing these compounds is fixed in a stable fashion. During image formation, non-image areas become alkali-soluble due to the release of the above-described interaction by the energy of an infrared ray and the like from the exterior, and in the present invention, it is thought that, because the interaction is a complex-complementary interaction caused by the aqueous alkali solution-soluble polymer, the infrared absorber, and the multi-functional amine compound, a greater release than when a normal combination of an aqueous alkali solution-soluble polymer and an infrared absorber is used occurs in non-image portions. Thus, the present inventors have found that high sensitivity and discrimination in image formation can be attained by the present invention. Further, it was found that changes in solubility with the passage of time and changes in the sensitivity of a planographic printing material can be suppressed, thus completing the present invention.

SUMMARY OF THE INVENTION

The object of the present invention is to provide a positive planographic printing material which can be used for direct plate making by performing recording thereon based on digital data from a computer and the like using a solid laser or a semiconductor laser emitting infrared rays, has high sensitivity to an infrared ray laser, is excellent in development latitude, and in addition, has excellent storage stability over time.

Namely, an object of the present invention is to provide a positive planographic printing material comprising the following components (A) to (C):

(A) a polyfunctional amine compound, (B) a polymer which is water-insoluble and aqueous alkali solution-soluble and (C) an infrared absorber.

DETAILED DESCRIPTION OF THE INVENTION

The positive planographic printing material of the present invention will be illustrated in detail below.

[Polyfunctional Amine Compound]

The positive planographic printing material of the present invention contains a polyfunctional amine compound. This polyfunctional amine compound, by being made to coexist with the aqueous alkali solution-soluble polymer described below, performs the function of interacting strongly with the alkali-soluble group in the polymer so as to stabilize the film structure of the photosensitive film of the planographic printing material (on occasion, referred to below as a "pseudo-crosslinking action").

The term "polyfunctional amine compound" used in the present invention refers to an amine compound having at least two or more functional groups. If there is one functional groups, the pseudo-crosslinking action does not occur, which is unsuitable in the present invention. The lower limit of the number of functional groups is two. The number of functional groups is preferably three or more as this allows a stronger network to be formed.

The upper limit of the number of functional groups is preferably 10 or less, and more preferably 6 or less in view of production suitability and so that insoluble complexes are not formed by a strong interaction between the polyfunctional groups.

The polyfunctional amine compound used in the present invention is preferably water-soluble or water-dispersible. If sufficient water-solubility or water-dispersibility is imparted to the amine compound through by the use of so-called neutral water, the homogeneous developing solution permeates sufficiently into the a planographic printing material and excellent development performance is obtained without losing image discrimination, when conducting alkali development which is described later. Note that, in the present invention, the term “water solubility” preferably refers to a water solubility of 0.5 g per liter of water or more. Further, in the present invention, the term “water dispersibility” preferably refers to a water dispersibility of 0.5 g per liter of water or more.

It is preferable that the polyfunctional amine compound used in the present invention has no onium structure from the stand point of development performance. As the polyfunctional amine compound suitably used in the present invention, compounds obtained by adding an amine compound to commercially available polyfunctional polymerizable monomers are listed.

Examples of the polyfunctional polymerizable monomer preferably used include acrylate monomers such as ethylene glycol diacrylate, triethylene glycol diacrylate, 1,3-butane diol diacrylate, tetramethylene glycol diacrylate, propylene glycol diacrylate, neopentyl glycol diacrylate, trimethylolpropane triacrylate, trimethylolpropane tri (acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, polyester acrylate oligomer and the like; and epoxy monomers such as trimethylolpropane polyglycidyl ether, neopentyl glycol diglycidyl ether, glycerol polyglydicyl ether, ethylene glycol diglycidyl ether, sorbitol polyglycidyl ether, 1,4-cyclohexane dimethanol diglycidyl ether, triphenylolmethane glycidyl ether, tetraphenylolethane glycidyl ether and the like.

These polyfunctional polymerizable monomers can form adducts with ammonia or a primary or secondary amine compound to obtain polyfunctional amine compounds used in the present invention.

The amine compound used to form an adduct with a polyfunctional polymerizable monomer is not particularly limited providing it is ammonia or a primary or secondary amine. As the preferable amine compound, amine compounds having 2 to 12 carbon atoms are preferable and examples thereof include dimethylamine, diethylamine, morpholine, pyrrolidine, piperidine, ammonia, methylamine, ethylamine, di-n-propylamine, diisopropylamine, di-n-butylamine, methylphenylamine, Primen Amines™ (manufactured by Rohm & Haas Japan Co,. Ltd.), and the like. Further, amino acids such as glycine, alanine and the like can also be favorably used.

Preferable examples of the adduct of a polyfunctional polymerizable monomer with an amine include those represented by the general formulas (I) and (II) shown below.

(I)

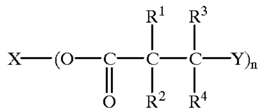

(II)

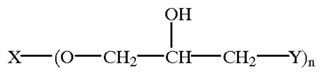

wherein X represents an n-valent organic group, $R^1$ to $R^4$ each independently represents a hydrogen atom or an alkyl group, Y represents $—NR^5R^6$, $R^5$ and $R^6$ each independently represents a hydrogen atom, an alkyl group optionally having one or more substituents, or an aryl group optionally having one or more substituents, and wherein $R^5$ and $R^6$ may bond with each other to form a ring, and n represents an integer from 2 to 10.

The polyfunctional amine compound used in the present invention may be used singly or in combinations of two or more.

Specific examples of the polyfunctional amine compound suitably used in the present invention include, but are not limited to the following compounds.

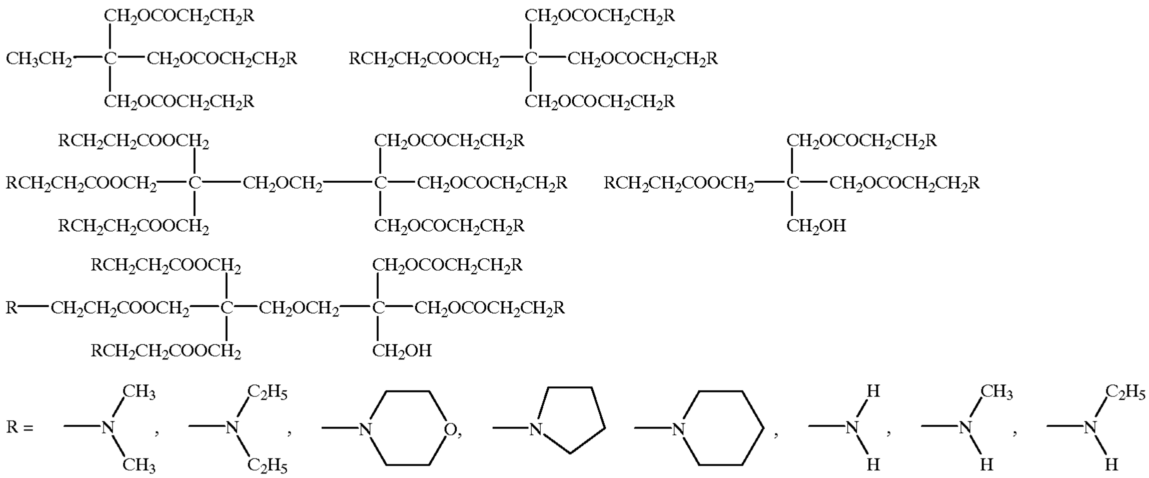

-continued

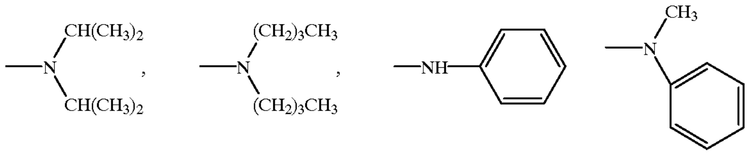

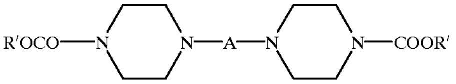

$A = -(CH_2)_n-$ n = 1, 2, 3, 4, 5, 6

$-(CH_2CH_2O)_2-CH_2CH_2-$ $R' = -CH_3$, $-C_2H_5$,

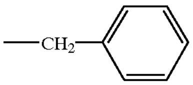

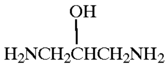

$H_2NCH_2CH_2NHCH_2CH_2OH$

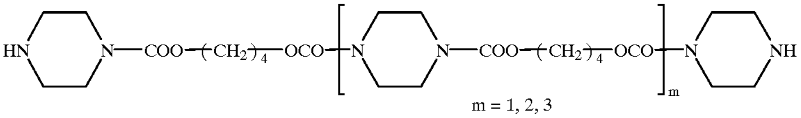

m = 1, 2, 3

$H_2NCH_2CH_2OCH_2CH_2NH_2$ $H_2NCH_2CH_2OCH_2CH_2OCH_2CH_2NH_2$ $H_2NCH_2CH_2CH_2OCH_2CH_2CH_2CH_2OCH_2CH_2CH_2NH_2$ $H_2NCH_2CH_2CH_2OCH_2CH_2OCH_2CH_2OCH_2CH_2CH_2NH_2$

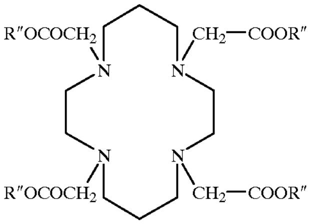

$R'' = -CH_3$, $-C_2H_5$

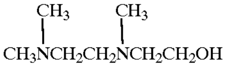

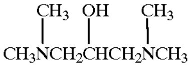

$HOCH_2CH_2NHCH_2CH_2NHCH_2CH_2OH$

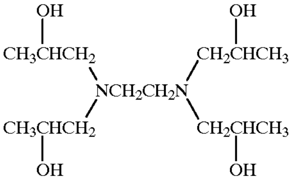

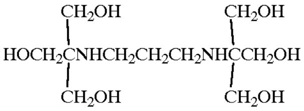

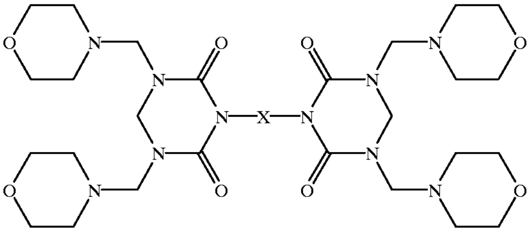

X =

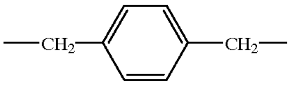

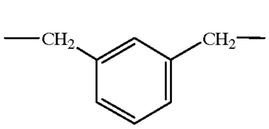

$-(CH_2)_3-$ $-(CH_2)_4-$

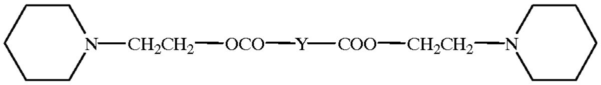

$Y = -CH_2CH_2-$ $-(CH_2)_3-$ $-(CH_2)_4-$ $-(CH_2)_5-$ single bond $-CH_2-$

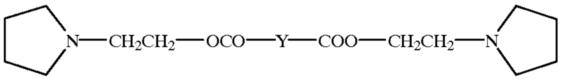

$Y = -CH_2CH_2-$ $-(CH_2)_3-$ $-(CH_2)_4-$ $-(CH_2)_5-$ single bond $-CH_2-$ $H_2NCH_2CH_2NHCH_2CH_2NH_2$ $H_2NCH_2CH_2NHCH_2CH_2CH_2NH_2$

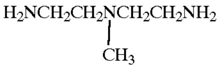

$H_2NCH_2CH_2CH_2NHCH_2CH_2CH_2NH_2$

-continued
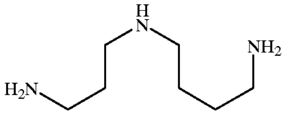 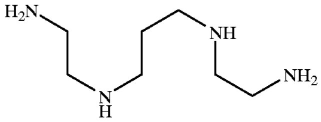 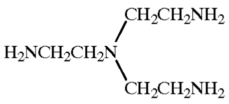 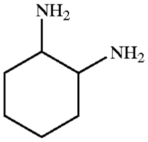
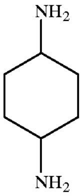 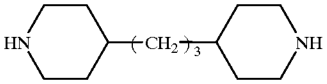 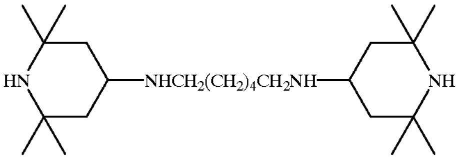
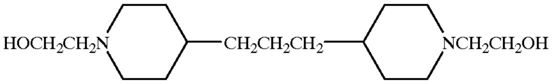 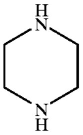 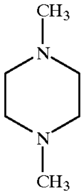 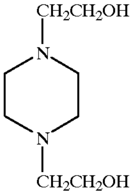 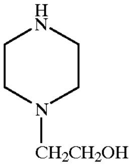
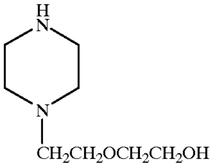 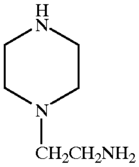 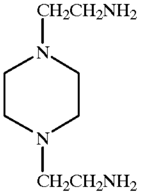 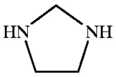 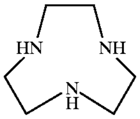 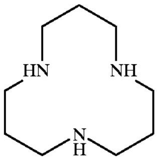
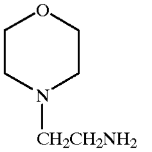 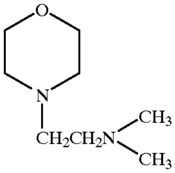 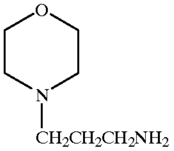 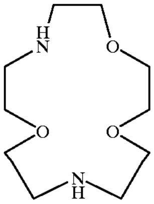 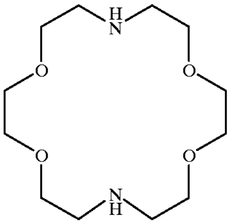
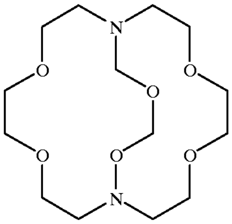 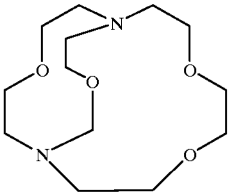 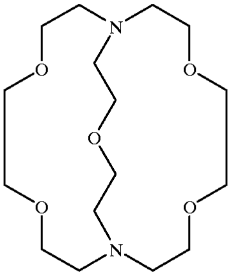
$H_2N—Z—NH_2$ $Z = —(CH_2)_n—$ $n = 1\sim12$ 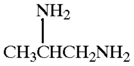 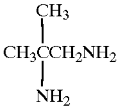 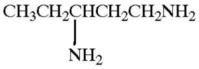 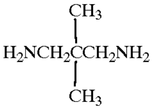
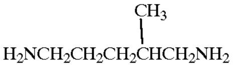 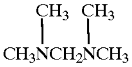 $CH_3NHCH_2CH_2NH_2$ $CH_3CH_2NHCH_2CH_2NH_2$ $H_2NCH_2CH_2NHCH_2CH_2CH_3$
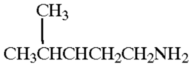 $CH_3NHCH_2CH_2NHCH_3$ 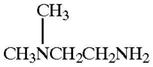 $CH_3CH_2NHCH_2CH_2NHCH_2CH_3$ 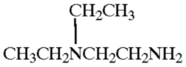
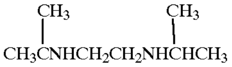 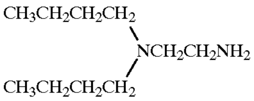 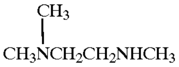 

-continued
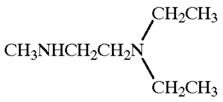 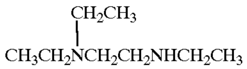 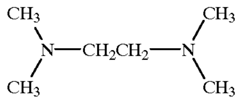 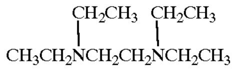
$CH_3NHCH_2CH_2CH_2NH_2$ 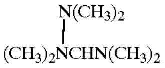 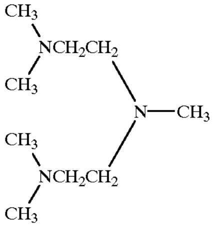 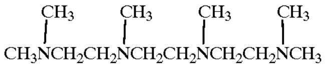
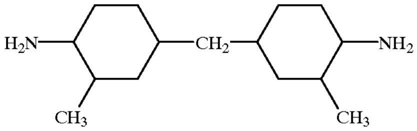 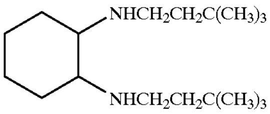 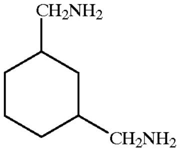 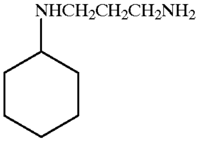
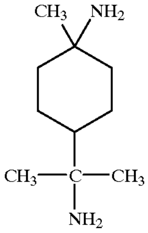 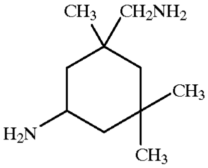 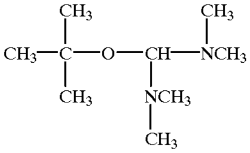 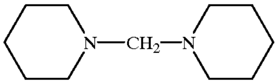
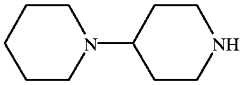 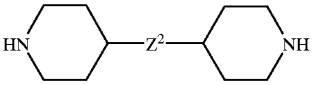 $Z^2$ = single bond $-(CH_2)_2-$ $-(CH_2)_3-$
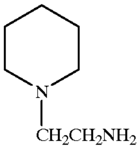 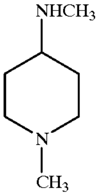 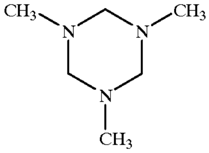 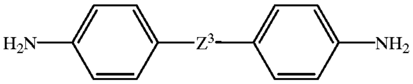 $Z^3$ = $-CH_2-$
$-(CH_2)_2-$ $-CH{=}CH-$ $-S-$ $-O-$ 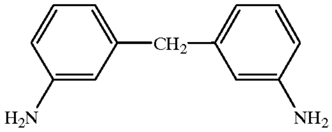
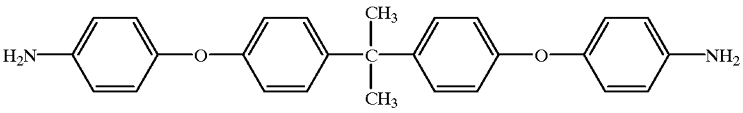
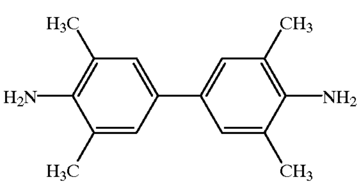 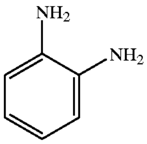 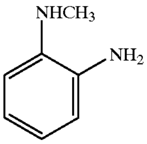 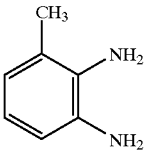 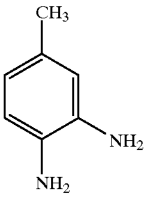

-continued
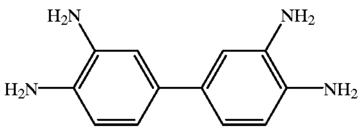
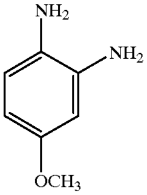
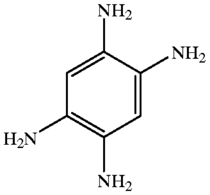
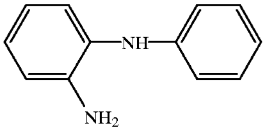
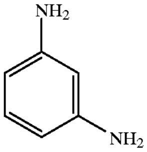
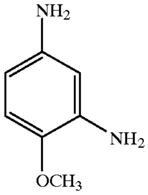
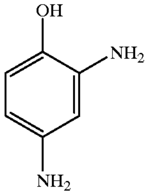
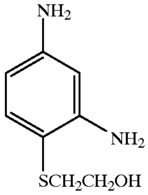
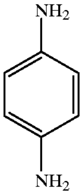
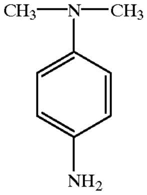
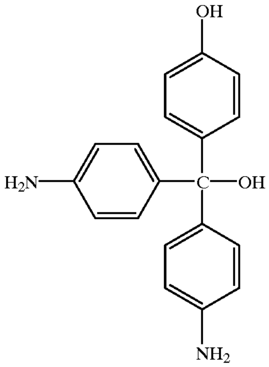
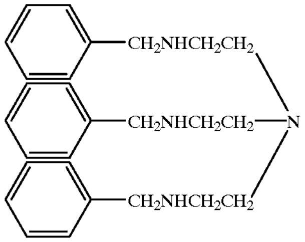
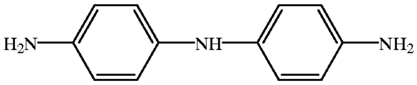
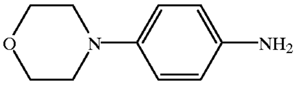
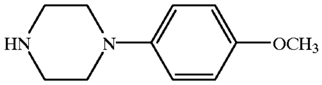
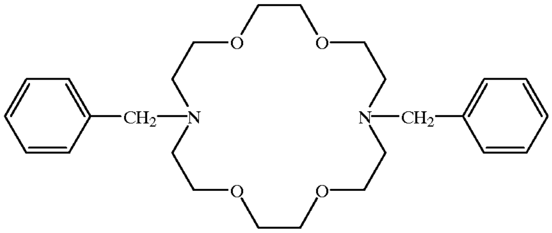
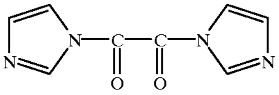
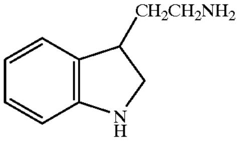
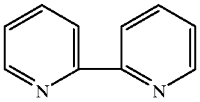
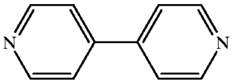
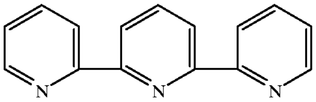
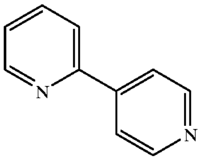
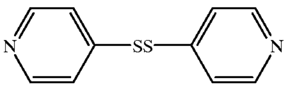
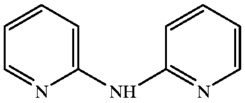
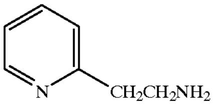
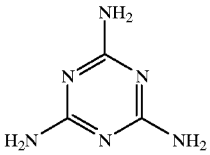
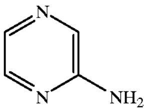
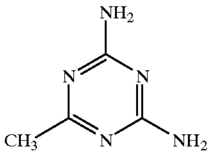

Specific examples of the synthesis of the polyfunctional amine compound in the present invention are shown below. Note that the polyfunctional amines A and E obtained in the following synthesis examples are used in the examples described later.

The polyfunctional amine compound which is an adduct of a polyfunctional polymerizable monomer with an amine compound used in the present invention may contain as an impurity a compound in which a part of the polymerizable site of a polyfunctional polymerizable monomer does not form an adduct with an amine compound. In this case, the impurity content is preferably 50% by weight or less, more preferably 40% by weight or less.

Synthesis of Polyfunctional Amine Compound A)

6.4 g of pentaerythritol tetraacrylate (ATMMT, manufactured by Shin Nakamura Kagaku K.K.) was dissolved in 50 ml of methanol, the mixture was stirred at room temperature, and to this was added dropwise 8.7 g of morpholine. The reaction progressed generating heat, and then the mixture was heated further to 60° C. and the reaction solution was stirred for 5 hours. After the reaction, the solvent was distilled off under reduced pressure to obtain 15 g of an oily substance containing as a main component the polyfunctional amine compound A.

Synthesis of Polyfunctional Amine Compound E)

6.4 g of pentaerythritol tetraacrylate (ATMMT, manufactured by Shin Nakamura Kagaku K.K.) was dissolved in 50 ml of methanol, the mixture was stirred at room temperature, and to this was added dropwise 7.1 g of pyrrolidine. The reaction progressed generating heat, and then the mixture was heated further to 60° C. and the reaction solution was stirred for 5 hours. After the reaction, the precipitate in the reaction solution was filtrated off and the filtrate solvent was distilled off under reduced pressure to obtain 13 g of an oily substance containing as a main component the polyfunctional amine compound E.

The polyfunctional amine compound in the present invention may be added to a layer containing other constituent components described below (that is, a photosensitive layer) or may be added to at least one of another adjacent layer, for example, an undercoat layer, in a planographic printing material. In the present invention, the term "planographic printing material" is a concept which includes materials constituting all layers including not only a photosensitive layer but also a layer to which a polyfunctional amine compound of the present invention is added.

When a polyfunctional amine compound is added to a photosensitive layer in the present invention, the amount added is preferably in the range of from 3% by weight to 50% by weight, and more preferably in the range of from 10% by weight to 20% by weight based on an aqueous alkali solution-soluble polymer (B). An amount added of less than 3% by weight is not preferable since then the effect of the present invention is not manifested sufficiently, on the other hand, an amount added of over 50% by weight is not preferable since then coating suitability and film forming properties deteriorate.

When a polyfunctional amine compound is added to another adjacent layer, for example, to an undercoat layer, the amount added is preferably in the range of from 2 $mg/m^2$ to 200 $mg/m^2$, more preferably in the range of from 5 $mg/m^2$ to 100 $mg/m^2$.

[(B) water-insoluble and Aqueous Alkali Solution-soluble Polymer]

In the materials constituting a photosensitive layer in the positive planographic printing material of the present invention, (B) a water-insoluble and aqueous alkali solution-soluble polymer (i.e. an aqueous alkali solution-soluble polymer), namely, a homopolymer containing an acidic group on the main chain and/or side chain in the polymer, a copolymer thereof or mixture thereof is used as a binder polymer. Therefore, the positive planographic printing material of the present invention can be developed with an alkali developing solution.

Among these, those containing on the main chain and/or side chain of a polymer at least one acidic group from the following groups (1) to (6) are preferable from the standpoints of solubility in an alkaline developing solution and manifestation of solution suppressing ability.

(1) Phenol group (—Ar—OH)

(2) Sulfonamide group ($—SO_2NH—R$)

(3) Substituted sulfonamide type acidic group (hereinafter, referred to as "active imide group") [$—SO_2NHCOR$, $—SO_2NHSO_2R$, $—CONHSO_2R$]

(4) Carboxyl group ($—CO_2H$)

(5) Sulfonic acid group ($—SO_3H$)

(6) Phosphoric acid group ($—OPO_3H_2$)

In the above-described groups (1) to (6), Ar represents a divalent aryl connecting group optionally having one or more substituents and R represents a hydrocarbon group which may be substituted.

Among aqueous alkali solution-soluble polymers having an acidic group selected from the above-described groups (1) to (6), aqueous alkali solution-soluble polymers having (1) a phenol group, (2) a sulfonamide group or (3) an active imide group are preferable, and particularly, aqueous alkali solution-soluble polymers having (1) a phenol group or (2) a sulfonamide group are most preferable from the standpoints of securing sufficient solubility in an alkali developing solution, development latitude and film strength.

Examples of the aqueous alkali solution-soluble polymer having an acidic group selected from the above-described groups (1) to (6) include the following polymers.

Examples of the aqueous alkali solution-soluble polymer having a (1) phenol group include novolak resins such as a condensation product of a phenol and a formaldehyde, a condensation product of a m-cresol and a formaldehyde, a condensation product of a p-cresol and a formaldehyde, a condensation product of a m/p-mixed cresol and a formaldehyde, a condensation product of a phenol, a cresol (any of m-, pe-, or m-/p-mixed) and a formaldehyde, and a condensation product of a pyrogallol and an acetone. Further, copolymers obtained by copolymerization with a compound having a phenol group as the said chain can also be listed.

Examples of the compound having a phenol group include acrylamides, methacrylamides, acrylates, methacrylates, hydroxystyrenes and the like having a phenol group.

Specific examples include N-(2-hydroxyphenyl) acrylamide, N-(3-hydroxyphenyl)acrylamide, N-(4-hydroxyphenyl)acrylamide, N-(2-hydroxyphenyl) methacrylamide, N-(3-hydroxyphenyl)methacrylamide, N-(4-hydroxyphenyl)methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl)ethyl acrylate, 2-(3-hydroxyphenyl)

ethyl acrylate, 2-(4-hydroxyphenyl)ethyl acrylate, 2-(2-hydroxyphenyl)ethyl methacrylate, 2-(3-hydroxyphenyl) ethyl methacrylate, 2-(4-hydroxyphenyl)ethyl methacrylate and the like.

Aqueous alkali solution-soluble polymers having a weight-average molecular weight of $5.0\times10^2$ to $2.0\times10^4$ and having a number-average molecular weight of $2.0\times10^2$ to $1.0\times10^4$are preferable in view of their image forming properties. These polymers may be used singly and may also be used in combinations of two or more. When used in combination, a condensed compound of a phenol and a formaldehyde having, as a substituent, an alkyl group having 3 to 8 carbon such as a condensed compound of a t-butylphenol and a formaldehyde or a condensed compound of an octylphenol and a formaldehyde atoms may also be used together therewith as described in U.S. Pat. No. 4,123, 279.

Examples of the aqueous alkali solution-soluble polymer having (2) a sulfonamide group include polymers structured to have as their main constituent component the minimum constituent unit derived from compounds having a sulfonamide group. As the above-described compound, compounds having in the molecule one or more sulfonamide groups in which at least one hydrogen atom is connected to a nitrogen atom and one or more polymerizable unsaturated groups are listed. Among these, compounds having a lower molecular weight and having in the molecule an acryloyl group, allyl group or vinyloxy group and a substituted or mono-substituted aminosulfonyl group or a substituted sulfonylimino group are preferable, and specific examples thereof include the compounds represented by the general formulas (III) to (VII) given below.

(III)

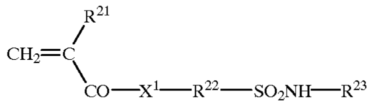

(IV)

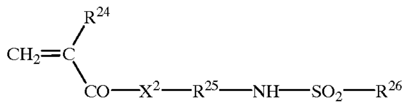

(V)

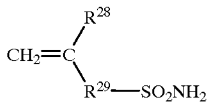

(VI)

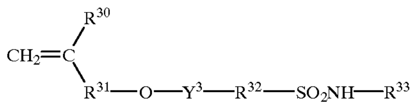

(VII)

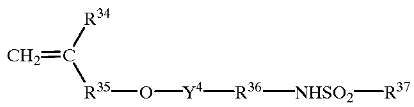

wherein $X^1$ and $X^2$ each independently represents —O— or —$NR^{27}$, $R^{21}$ and $R^{24}$ each independently represents a hydrogen atom or —$CH_3$, $R^{22}$, $R^{25}$, $R^{29}$, $R^{32}$ and $R^{36}$ each independently represents an alkylene group, cycloalkylene group, arylene group or aralkylene group having 1 to 12 carbon atoms optionally having one or more substituents, $R^{23}$, $R^{27}$ and $R^{33}$ each independently represents a hydrogen atom, or an alkyl group, cycloalkyl group, aryl group or aralkyl group having 1 to 12 carbon atoms optionally having one or more substituents. $R^{26}$ and $R^{37}$ each independently represents an alkyl group, cycloalkyl group, aryl group or aralkyl group having 1 to 12 carbon atoms optionally having one or more substituents, $R^{28}$, $R^{30}$ and $R^{34}$ each independently represents a hydrogen atom or —$CH_3$, $R^{31}$ and $R^{35}$ each independently represents single bond, or an alkylene group, cycloalkylene group, arylene group or aralkylene group having 1 to 12 carbon atoms and which may be substituted, and $Y^3$ and $Y^4$ each independently represents single bond, or —CO—.

Favorably used compounds from among those represented by the general formulas (III) to (VII) include m-aminosulfonylphenyl methacrylate, N-(p-aminosulfonylphenyl)methacrylamide, N-(p-aminosulfonylphenyl)acrylamide, or the like, in the positive planographic printing material of the present invention.

Examples of the aqueous alkali solution-soluble polymer having (3) an active imide group include polymers structured to have as their main constituent component the minimum constituent unit derived from a compound having an active imide group. As the above-described compound, compounds having in the molecule one or more active imide groups and one or more polymerizable unsaturated groups represented by the following structural formula can be listed.

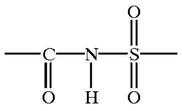

Specifically, N-(p-toluenesulfonyl)methacrylamide, N-(p-toluenesulfonyl)acrylamide or the like can be preferably used.

Examples of the aqueous alkali solution-soluble polymer having (4) a carboxyl group include polymers structured to have as their main constituent component the minimum constituent unit derived from compounds having in the molecule one or more carboxyl groups and one or more polymerizable unsaturated groups.

Examples of the aqueous alkali solution- soluble polymer having (5) a sulfonic acid group include polymers structured to have as their main constituent component the minimum constituent unit derived from compounds having in the molecule one or more sulfonic acid groups and one or more polymerizable unsaturated groups.

Examples of the aqueous alkali solution-soluble polymer having (6) a phosphoric acid group include polymers structured to have as the main constituent component a minimum constituent unit derived from compounds having in the molecule one or more phosphoric acid groups and one or more polymerizable unsaturated groups.

Particularly preferable examples of the above-described aqueous alkali solution-soluble polymers include aqueous alkali solution-soluble polymers having (1) a phenolic hydroxy group since a strong interaction can be obtained between with the above-described polyfunctional amine compound.

The minimum constituent unit having an acidic group selected from the above-described groups (1) to (6), which constitutes the aqueous alkali solution-soluble polymer used in the positive planographic printing material of the present invention, does not necessarily have to be used singly. Polymers obtained by copolymerizing two or more minimum constituent units having the same acidic group or by copolymerizing two or more minimum constituent units each having different acidic groups can be used preferably.

As the copolymerization method, a conventionally known graft copolymerization method, block copolymerization method, random copolymerization method and the like can be used.

The above-described copolymer preferably contains a compound containing at least one acidic group selected from the group consisting of (1) to (6) which is copolymerized in an amount of 10 mol % or more in the copolymer and those containing this compound in an amount of 20 mol % or more are more preferable. When the amount is less than 10 mol %, there is a tendency that development latitude is not able to be sufficiently improved.

In the present invention, other compounds which can be copolymerized to form a copolymer and are not containing an acidic group selected from the above-described groups (1) to (6) can also be used as the compound to form a copolymer. Examples of other compounds not containing acidic group selected from the above-described groups (1) to (6) include the compounds listed in the following (m1) to (m12).

(m1) Acrylic esters and methacrylic ester having an aliphatic hydroxyl group such as, for example, 2-hydroxyethyl acrylate, 2-hydroxyethyl methacrylate and the like.

(m2) Alkyl acrylates such as methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate, N-dimethylaminoethyl acrylate and the like.

(m3) Alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate, N-dimethylaminoethyl methacrylate and the like.

(m4) Acrylamides ormethacrylamides such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, N-ethyl-N-phenylacrylamide and the like.

(m5) Vinyl ethers such as ethyl vinyl ether, 2-chloroethyl vinyl ether, hydroxyethyl vinyl ether, propyl vinyl ether, butyl vinyl ether, octyl vinyl ether, phenyl vinyl ether and the like.

(m6) Vinyl esters such as vinyl acetate, vinylchloro acetate, vinyl butyrate, vinyl benzoate and the like.

(m7) Styrenes such as styrene, α-methylstyrene, methylstyrene, chloromethylstyrene and the like.

(m8) Vinyl ketones such as methyl vinyl ketone, ethyl vinyl ketone, propyl vinyl ketone, phenyl vinyl ketone and the like.

(m9) Olefins such as ethylene, propylene, isobutylene, butadiene, isoprene and the like.

(m10) N-vinylpyrrolidone, N-vinylcarbazole, 4-vinylpyridine, acrylonitrile, methacrylonitrile and the like.

(m11) Unsaturated imides such as maleimide, N-acryloylacrylamide, N-acetylmethacrylamide, N-propionylmethacrylamide, N-(p-chlorobenzoyl) methacrylamide and the like.

(m12) Unsaturated carboxylic acids such as acrylic acid, methacrylic acid, maleic anhydride, itaconic acid and the like.

As the aqueous alkali solution-soluble polymer used in the positive planographic printing material of the present invention, a polymer having a weight-average molecular weight of $1.0\times10^3$ to $2.0\times10^5$ and a number-average molecular weight of $5.0\times10^2$ to $1.0\times10^5$ is preferable in view of the sensitivity and development latitude thereof and, moreover, one having a dispersion degree (weight-average molecular weight/number-average molecular weight) of 1.1 to 10 is preferable, irrespective of whether the polymer is a homopolymer or a copolymer.

When a copolymer is used in the present invention, the compounding weight ratio of the minimum constituent unit derived from a compound having an acidic group selected from the above-described groups (1) to (6) constituting the main chain and/or the side chain of the copolymer to the other minimum constituent unit not containing acidic group selected from the above-described groups (1) to (6), constituting a part of the main chain and/or the side chain of the copolymer is preferably in the range of from 50:50 to 5:95, and more preferably in the range of from 40:60 to 10:90 from the standpoint of development latitude.

The above-described aqueous alkali solution-soluble polymer may be used alone or in combination of two or more. The amount thereof is preferably from 30 to 99% by weight, more preferably from 40 to 95% by weight, and especially preferably from 50 to 90% by weight based on the total amount of solid components in materials constituting the photosensitive layer of the positive planographic printing material.

If the added amount of the aqueous alkali solution-soluble polymer is less than 30% by weight, the durability of the recording layer tends to deteriorate. If the added amount is more than 99% by weight, both the sensitivity and the durability tend to deteriorate.

Examples of the solvent which can be used for the synthesis of the aqueous alkali solution-soluble polymer used in the present invention include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethylsulfoxide, water and the like. These solvents may be used singly or in combination of two or more.

[(C) Infrared Absorber]

An infrared absorber having an onium salt type structure is preferably used in the materials constituting a photosensitive layer in the positive planographic printing material of the present invention since positive action between constituent units of the polymer (development is suppressed in unexposed portions, but development-suppression releases or disappears in exposed portions) is required. Specifically, dyes such as cyanine pigment, pyrylium salt and the like can be preferably used.

Preferred examples of the dyes include cyanine dyes described in, e.g., JP-A Nos. 58-125,246, 59-84,356, 59-202,829 and 60-78,787, and cyanine dyes described in U.K. Patent No. 434,875.

Other suitable compounds are a near-infrared absorbing sensitizer described in U.S. Pat. No. 5,156,938, a substituted arylbenzo(thio)pyrylium salt described in U.S. Pat. No. 3,881,924, a trimethinethiapyrylium salt described in JP-A No. 57-142,645 (U.S. Pat. No. 4,327,169), pyrylium compounds described in JP-A Nos. 58-181,051, 58-220,143, 59-41,363, 59-84,248, 59-84,249, 59-146,063 and 59-146,061, a cyanine dye described in JP-A No. 59-216,146, a pentamethinethiopyrylium salt described in U.S. Pat. No.

4,283,475, and pyrylium compounds described in Japanese Patent Application Publication (JP-B) No. 5-13,514 and 5-19,702.

Further, examples of the preferred dyes are near-infrared absorbing dyes represented by the formulas (I) and (II) in U.S. Pat. No. 4,756,993.

Further, anionic infrared absorbers described in JP-A No. 10-79912 can also be preferably used. The term "anionic infrared absorber" refers to an agent which has no cationic structure in the mother nucleus of the dye which substantially absorbs infrared rays and has an anionic structure. Examples thereof include (c1) anionic metal complex, (c2) anionic carbon black, (c3) anionic phthalocyanine, and further, (c4) compounds represented by the following general formula (VIII), and the like. The counter cation in this type of anionic infrared absorber is a monovalent cation or a polyvalent cation.

General Formula VIII $$\{G_a^- — M — G_b\}_m \quad X^{m+}$$

wherein, $G_a^-$ represents an anionic substituent, and $G_b$ represents a neutral substituent, $X^{m+}$ represents 1 to m-valent cation including proton, and m represents an integer from 1 to 6.

The term "anionic metal complex" (cl) refers to a complex in which the central metal and the ligands in the complex portion, which substantially absorb light, as a whole form an anion.

As the anionic carbon black (c2), carbon blacks in which an anionic group such as a sulfonic acid group, carboxyl group, phosphonic acid group or the like is connected as a substituent are listed. Oxidation of the carbon black with a given acid, as well as other means as described in Carbon Black Manual, third ed. (edited by Carbon Black Institute, Apr. 5, 1995, published by Carbon Black Institute) p. 12, may be adopted for introducing these groups into the carbon black.

An anionic infrared absorber obtained by ion bonding an onium salt as the counter cation to an anionic group in this anionic carbon black is preferably used in the present invention, however, an adsorption product obtained by adsorption of an onium salt onto the carbon black is not included as one of the anionic infrared absorbers suitably used in the present invention. Moreover, a simple adsorption product does not provide the effect of the present invention.

The term "anionic phthalocyanine" (c3) refers to a compound in which an anionic group previously listed in the description of (c2) is bonded as a substituent to the phthalocyanine skeleton and which, as a whole, forms an anion.

Next, the compounds represented by the general formula (VIII) (c4) will be described in detail. In the general formula (VIII), M represents a conjugated chain, and this conjugated chain M may have one or more substituents and ring structure. The conjugated chain M can be represented by the following formula.

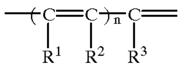

wherein $R^1$, $R^2$and $R^3$ each independently represents a hydrogen atom, halogen atom, cyano group, alkyl group, aryl group, alkenyl group, alkynyl group, carbonyl group, thio group, sulfonyl group, sulfinyl group, oxy group or amino group, and these may be connected together to form ring structure, and wherein n represents an integer from 1 to 8.

Among the anionic infrared absorbers represented by the general formula 6, A-1 to A-19 described below are preferably used.

A-1

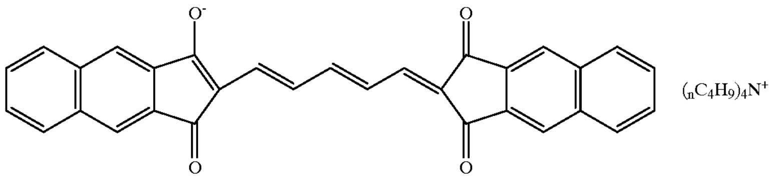

A-2

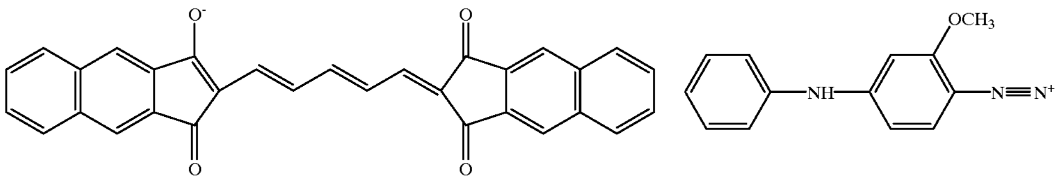

A-3

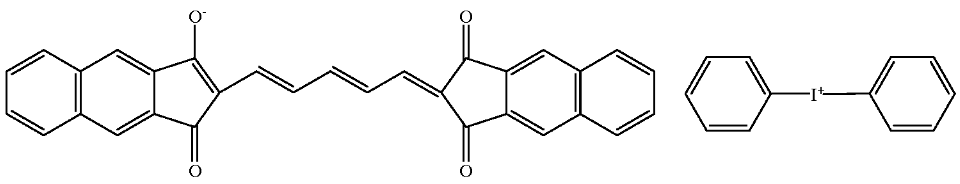

-continued
A-4
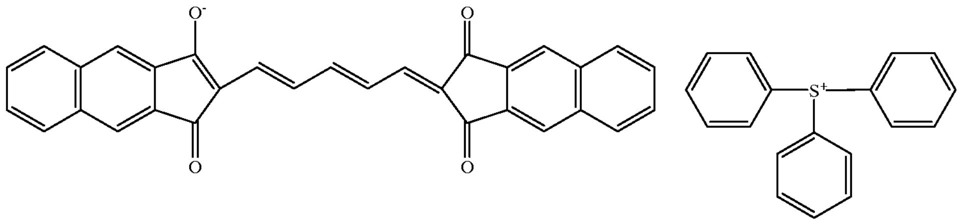
A-5
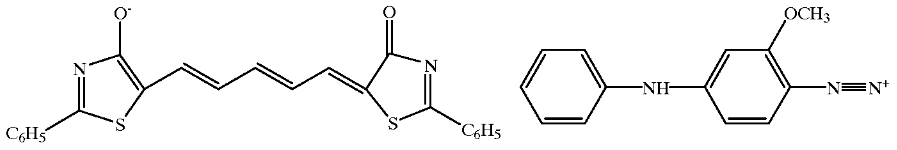
A-6
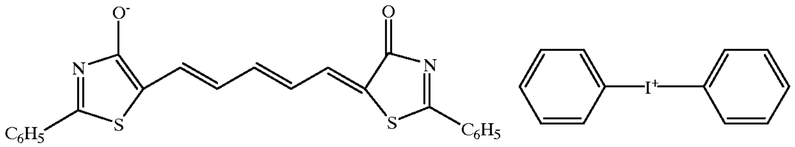
A-7
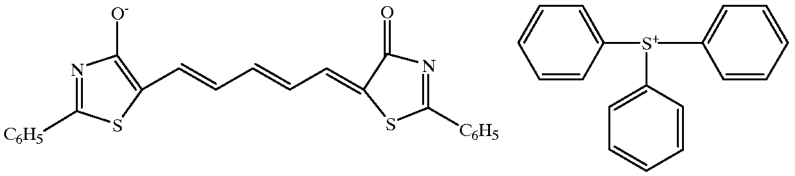
A-8
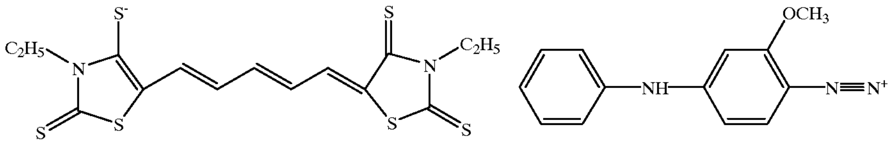
A-9
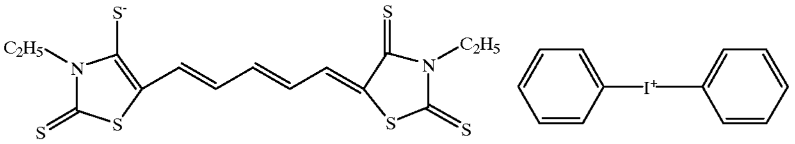
A-10
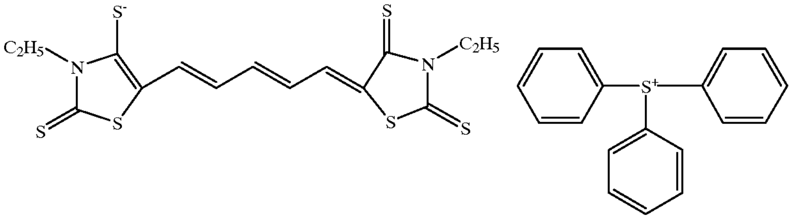
A-11
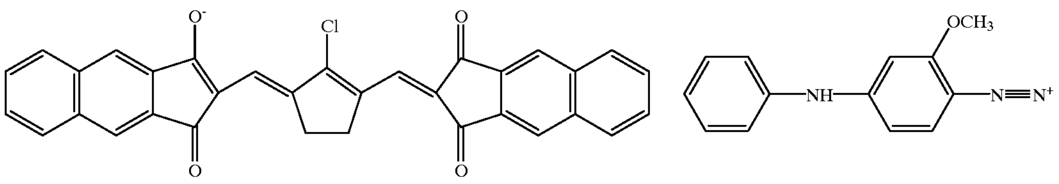

-continued

A-12

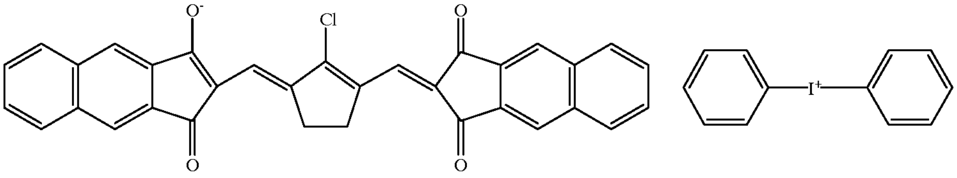

A-13

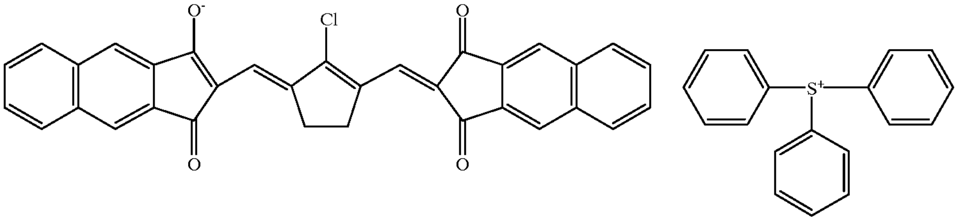

A-14 carbon-black——$CO_2^-$

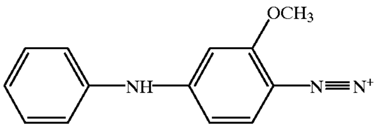

A-15 carbon-black——$CO_2^-$

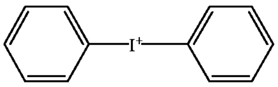

A-16 carbon-black——$CO_2^-$

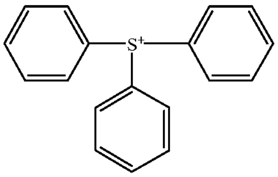

A-17

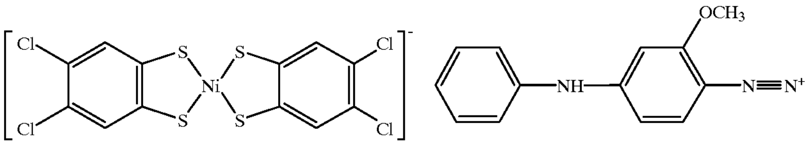

A-18

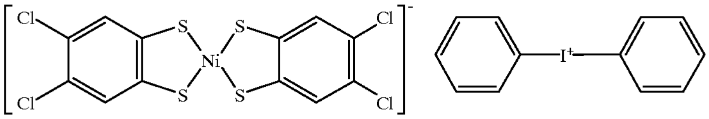

A-19

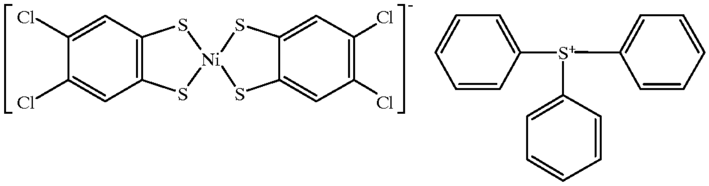

As the infrared absorber which can be used in a photosensitive layer in the positive planographic printing material of the present invention, there can be used, in addition to the above-described compounds, cationic infrared absorbers (CA-1 to CA-44) having an onium salt structure as shown below.

CA-1
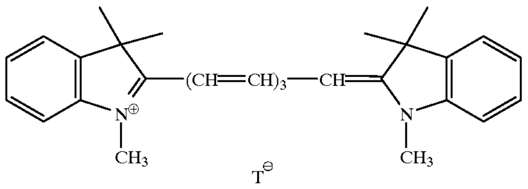
CA-2
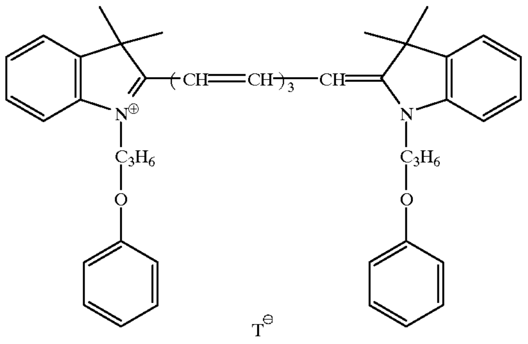
CA-3
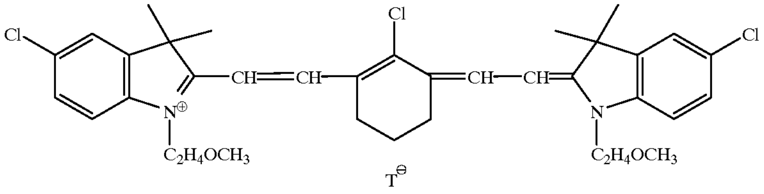
CA-4
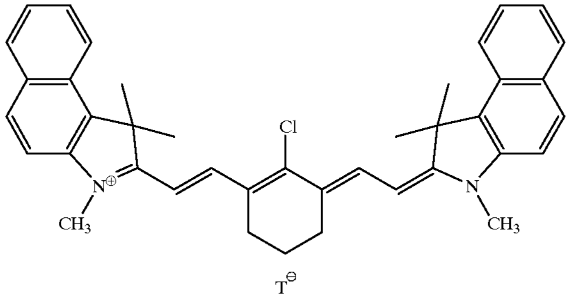
CA-5
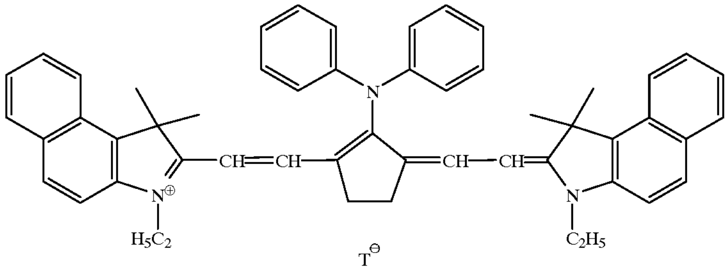
CA-6
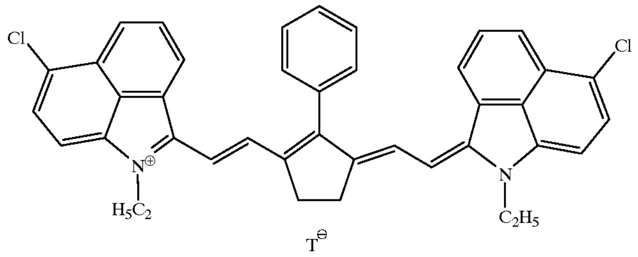

-continued
CA-7
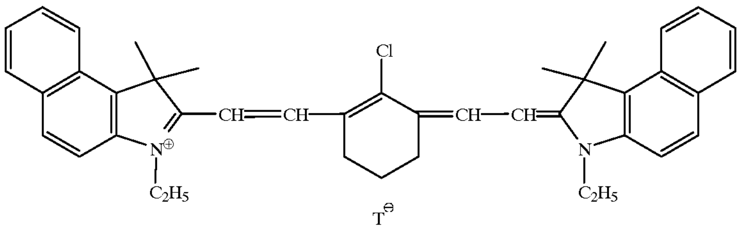
CA-8
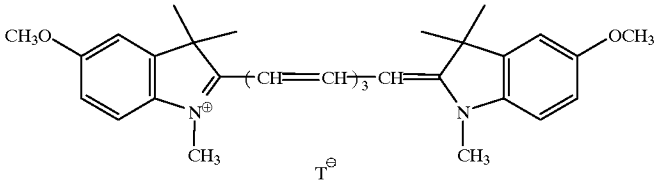
CA-9
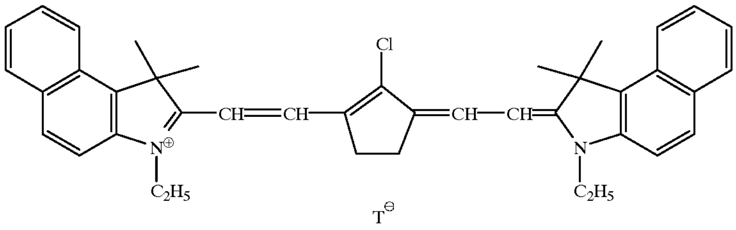
CA-10
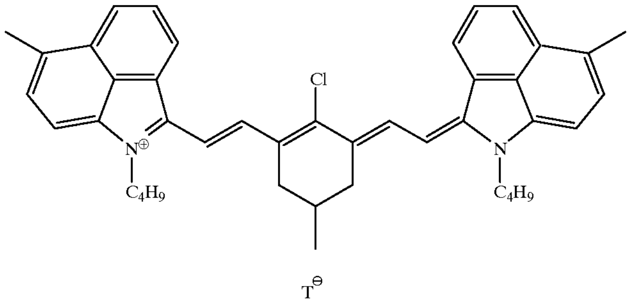
CA-11
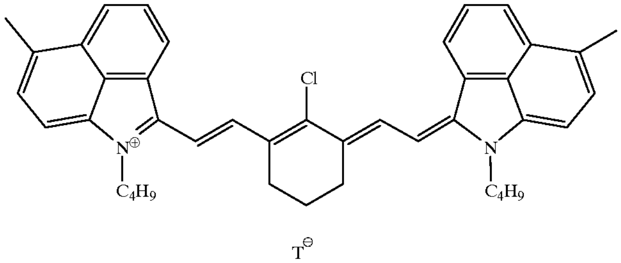
CA-12
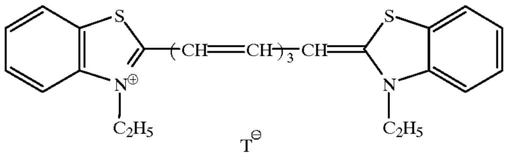

-continued
CA-13
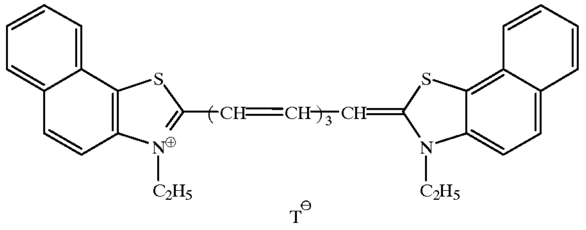
CA-14
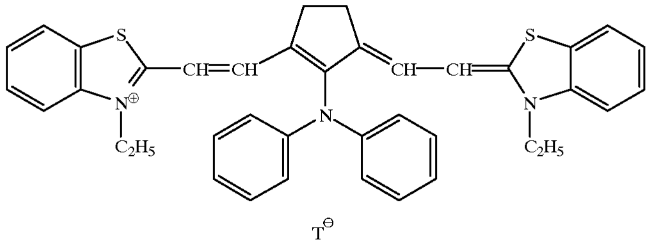
CA-15
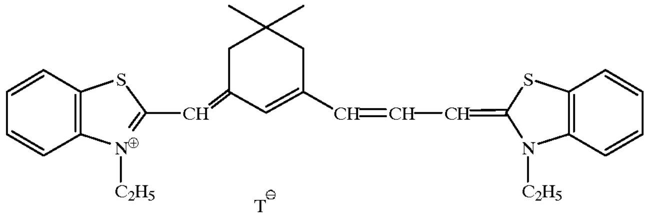
CA-16
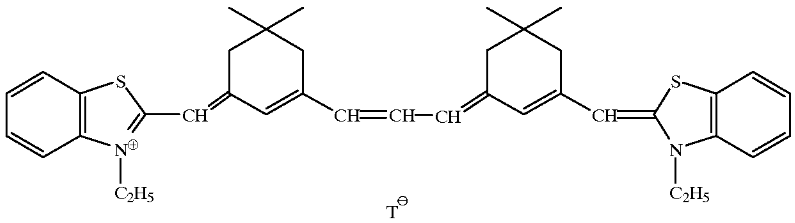
CA-17
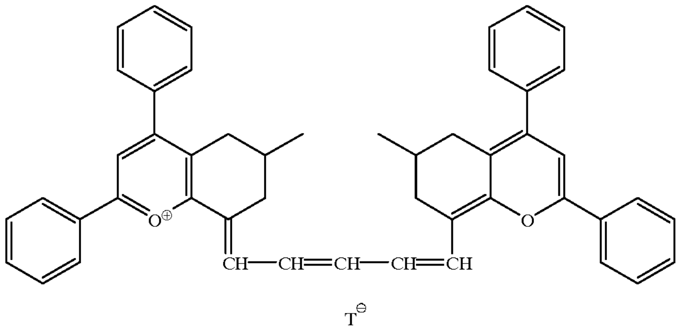
CA-18
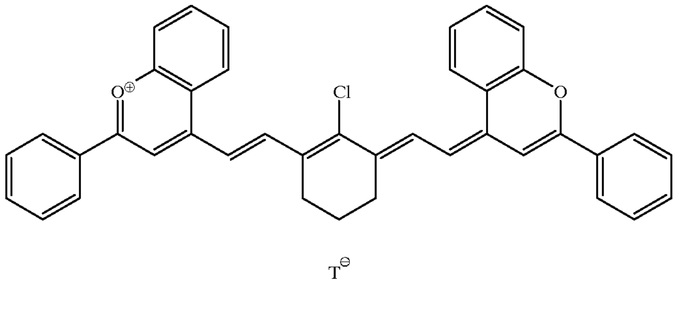

-continued
CA-19
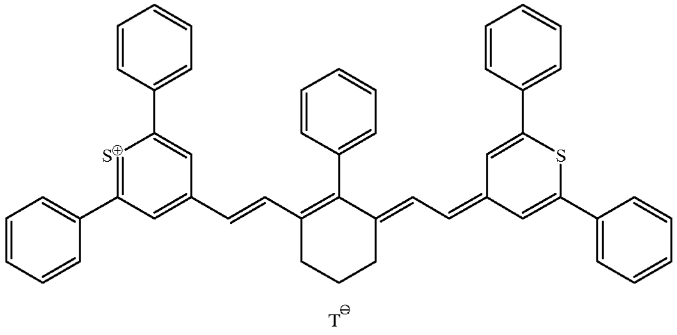
CA-20
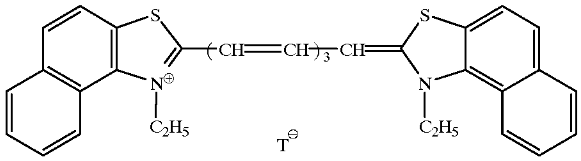
CA-21
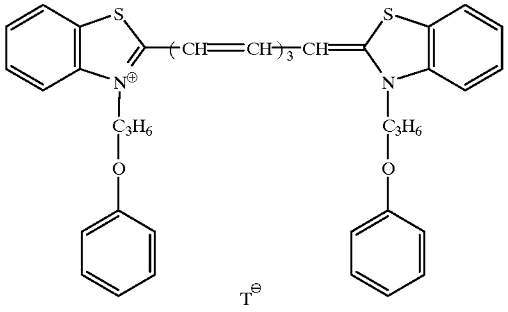
CA-22
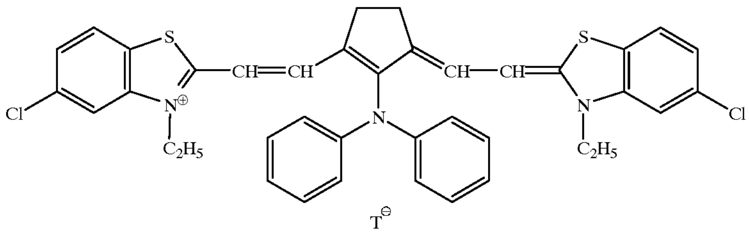
CA-23
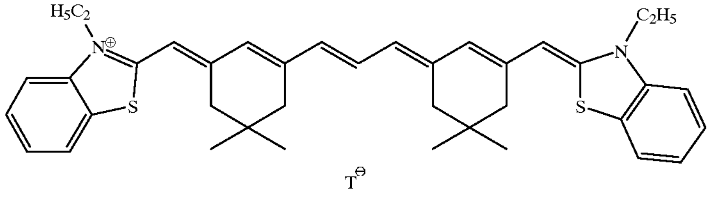
CA-24
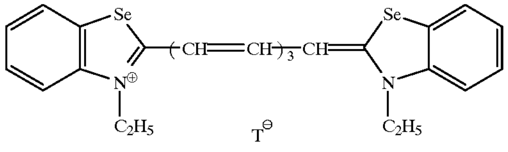

-continued
CA-25
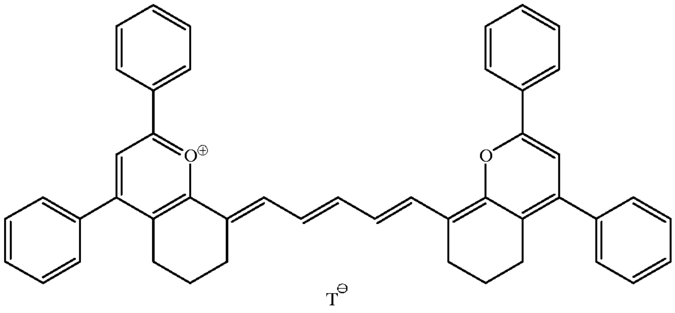
CA-26
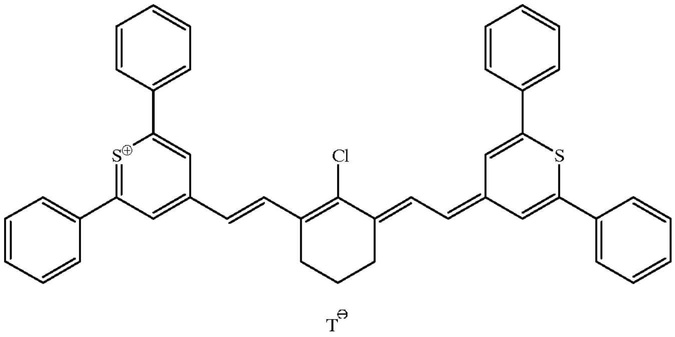
CA-27
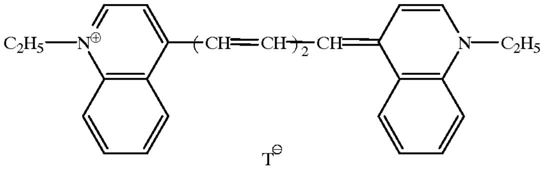
CA-28
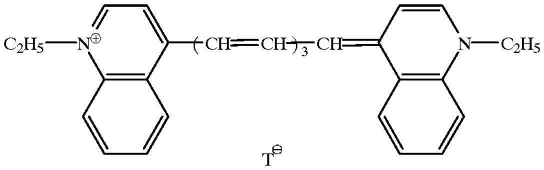
CA-29
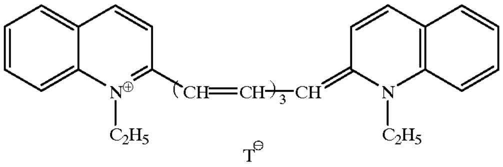
CA-30
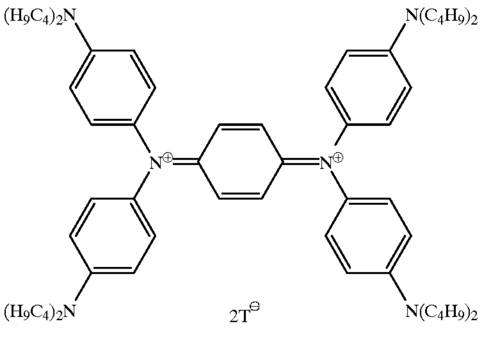

-continued
CA-31
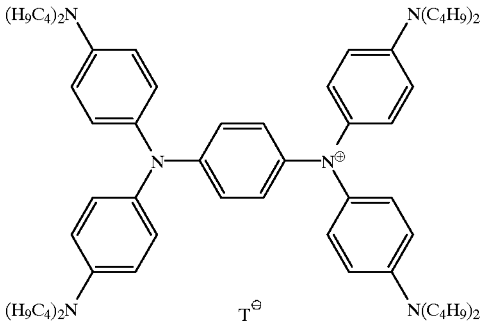
CA-32
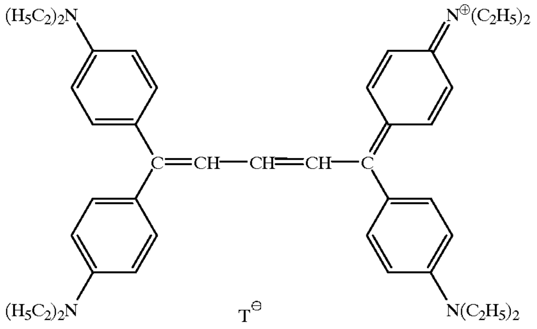
CA-33
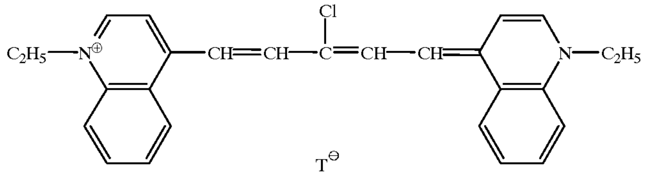
CA-34
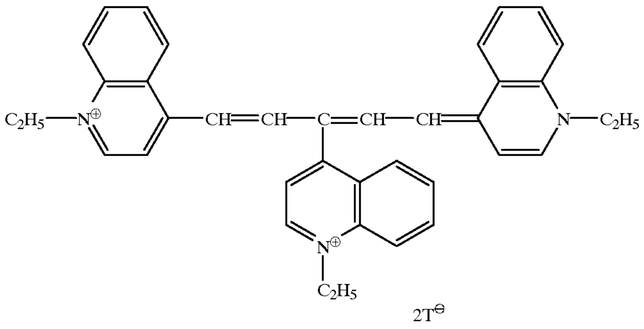
CA-35
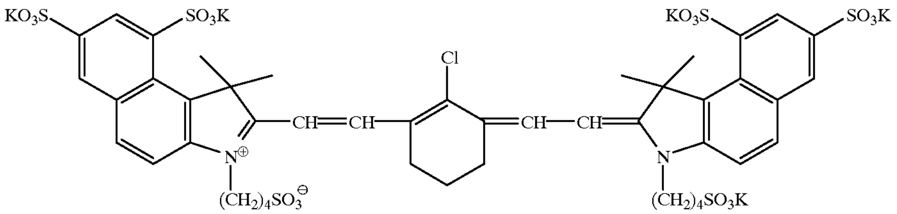

-continued
CA-36
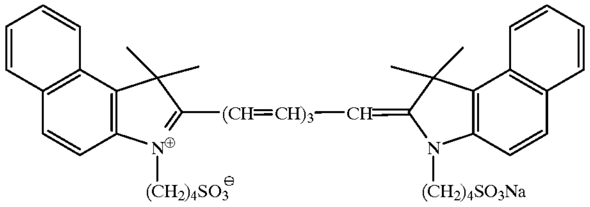
CA-37
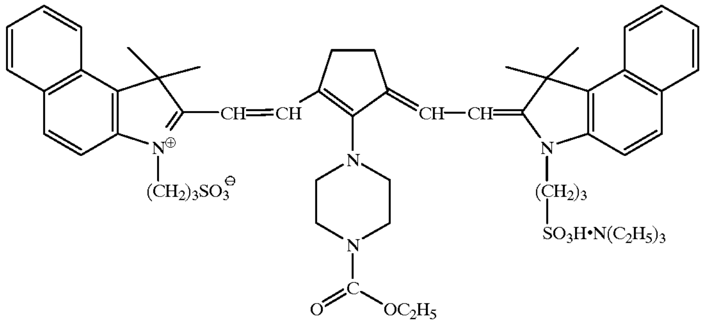
CA-38
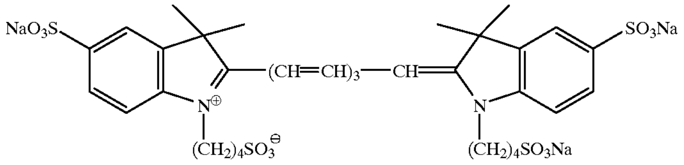
CA-39
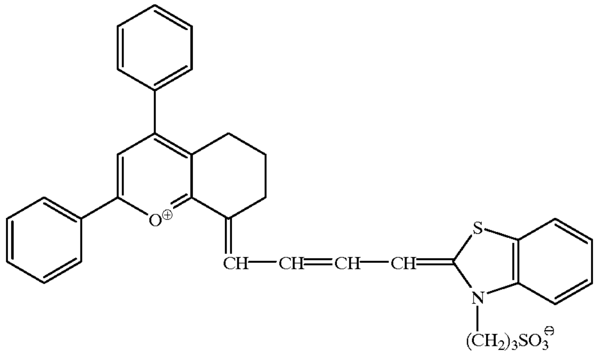
CA-40
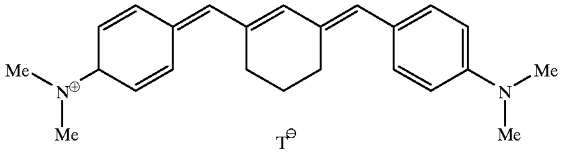
CA-41
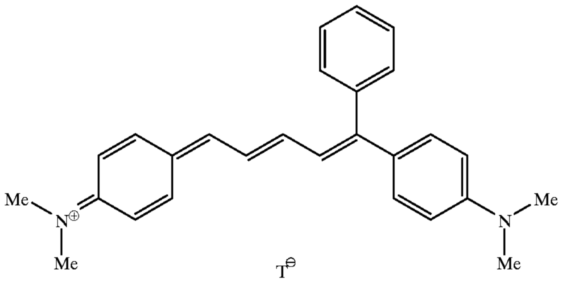

-continued

CA-42

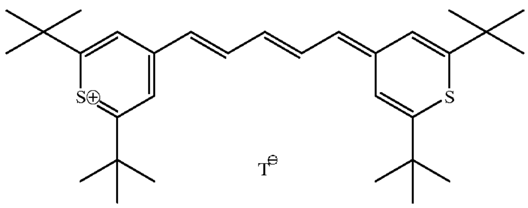

CA-43

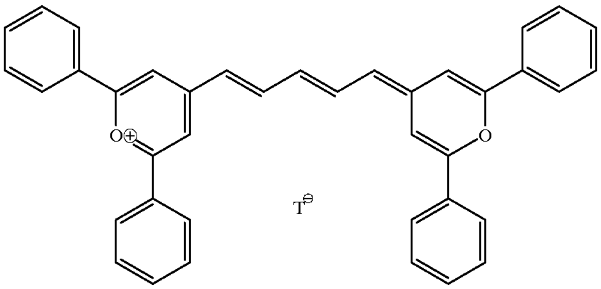

CA-44

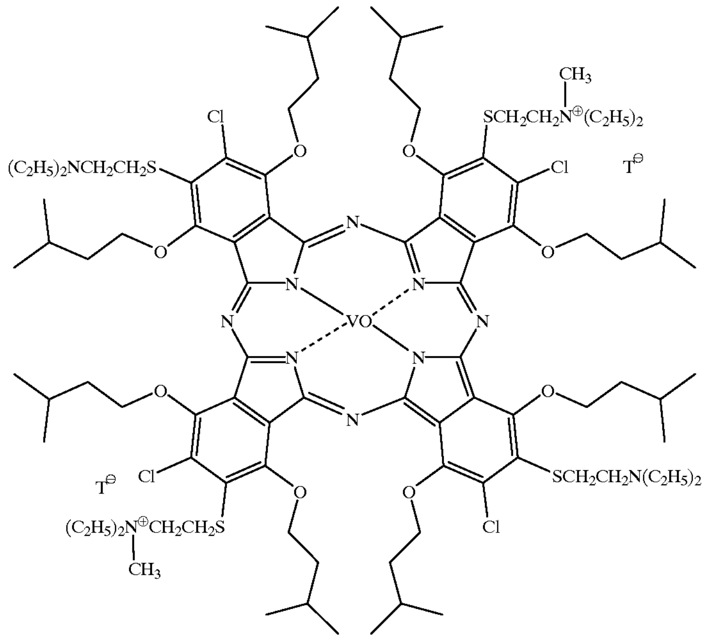

In the above-described structural formulas, $T^-$ represents a monovalent counter anion, preferably, a halogen anion ($F^-$, $Cl^-$, $Br^-$, $I^-$), a Lewis acid anion ($BF_4^-$, $PF_6^-$, $SbCl_6^-$, $ClO_4^-$), an alkylsulfonic acid anion or an arylsulfonic acid anion.

The alkyl in the above-described alkylsulfonic acid means a linear, branched or cyclic alkyl group having 1 to 20 carbon atoms, and specific examples thereof include a methyl group, ethyl group, propyl group, butyl group, pentyl group, hexyl group, heptyl group, octyl group, nonyl group, decyl group, undecyl group, dodecyl group, tridecyl group, hexadecyl group, octadecyl group, eicosyl group, isopropyl group, isobutyl group, s-butyl group, t-butyl group, isopentyl group, neopentyl group, 1-methylbutyl group, isohexyl group, 2-ethylhexyl group, 2-methylhexyl group, cyclohexyl group, cyclopentyl group and 2-norbornyl group. Among these, linear alkyl groups having 1 to 12 carbon atoms, branched alkyl groups having 3 to 12 carbon atoms and cyclic alkyl groups having 5 to 10 carbon atoms are more preferable.

The "aryl" in the above-described arylsulfonic acid is one which is composed of one benzene ring, one in which 2 or 3 benzene rings form a condensed ring, or one in which a benzene ring and 5-membered unsaturated ring form a condensed ring, and specific examples thereof include a phenyl group, naphthyl group, anthryl group, phenanthryl group, indenyl group, acenaphthenyl group and fluorenyl group. Among these, a phenyl group and a naphthyl group are more preferable.

Further, non-ionic infrared absorbers represented by the following NA-1 to NA-12 can also be preferably used.

NA-1
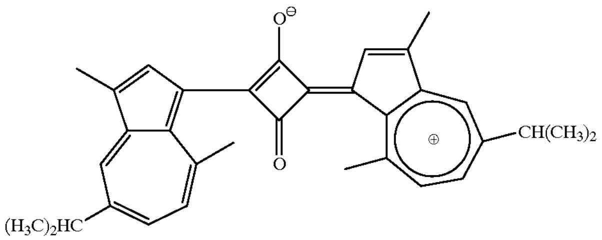
NA-2
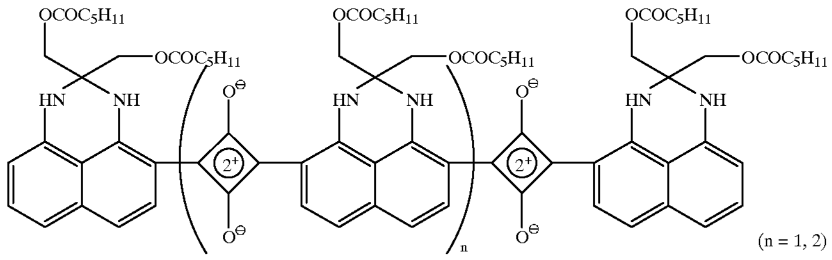
NA-3
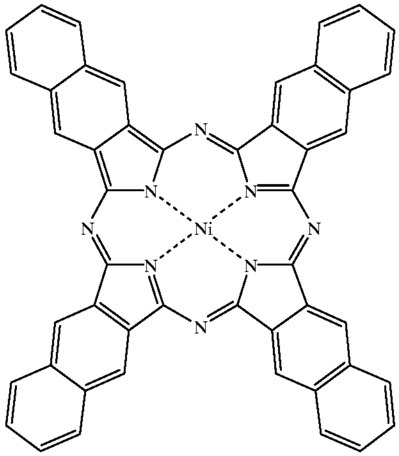
NA-4
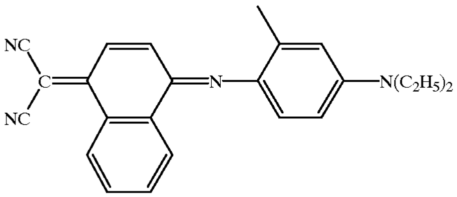
NA-5
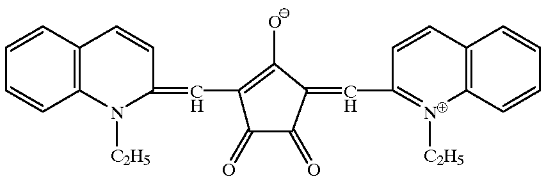
NA-6
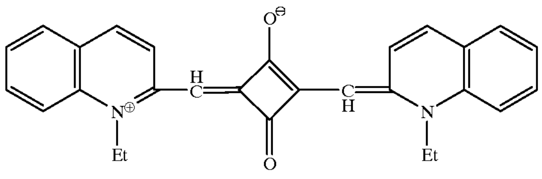

-continued
NA-7
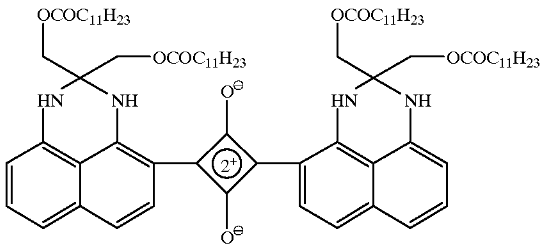
NA-8
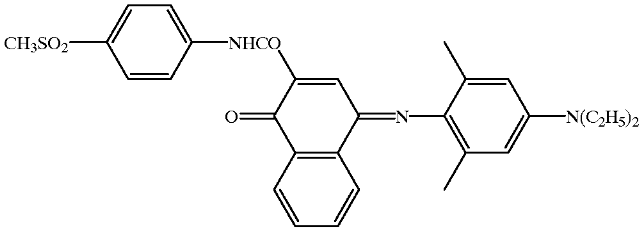
NA-9
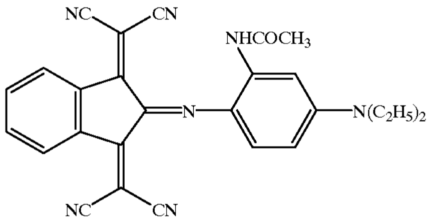
NA-10
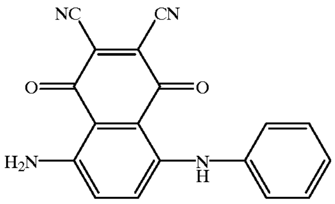
NA-11
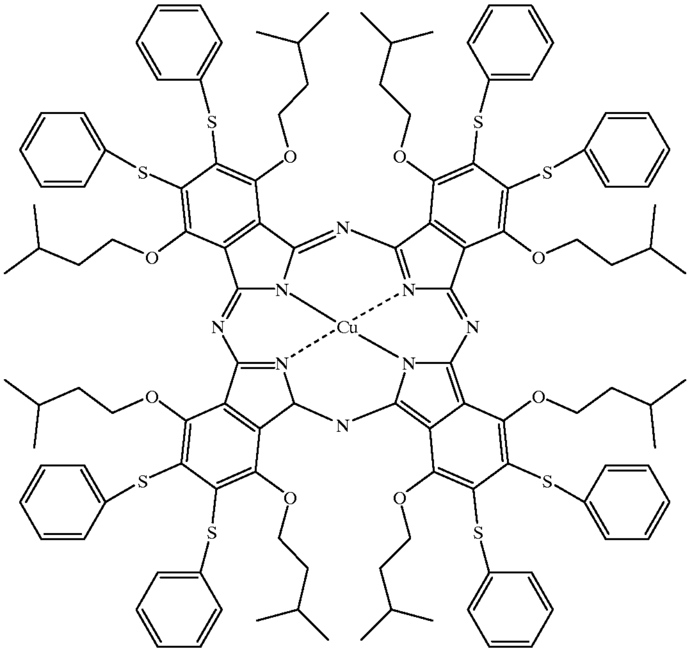

-continued

NA-12

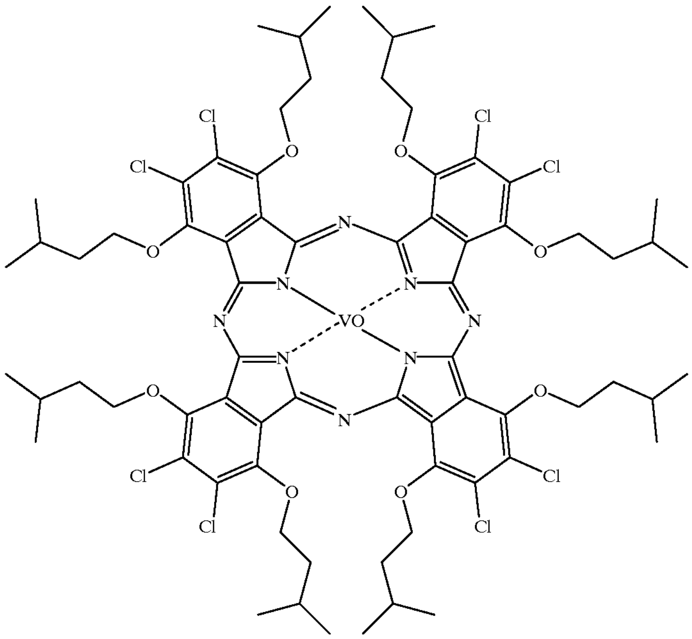

The amounts of these infrared absorbers added to the photosensitive layer of the planographic printing material are in the range of from 0.01 to 50% by weight, more preferably in the range of from 0.1 to 10% by weight, particularly in the range of from 0.5 to 10% by weight, based on the total amount of solid components in materials constituting the photosensitive layer of the positive planographic printing material. If the amount added is less than 0.01% by weight, the sensitivity of the photosensitive layer may decrease, whereas, if the amount added is more than 50% by weight, non-image areas tend to be smudged in printing.

The materials constituting a photosensitive layer of the positive planographic printing material of the present invention can include other dyes, pigments and the like for the purpose of further improving sensitivity and development latitude.

The dyes which can be used may be any known dyes, such as commercially available dyes or dyes described in, for example, "Dye Handbook" (edited by the Organic Synthetic Chemistry Association, published in 1970). Specific examples thereof include azo dyes, metal complex salt azo dyes, pyrazolone azo dyes, naphthoquinone dyes, anthraquinone dyes, phthalocyanine dyes, carbonium dyes, quinonimine dyes, methine dyes, diimmonium dyes, aminium dyes, squarylium pigments, metal thiolate complexes and the like.

The pigments which can be used include commercially available pigments, and pigments described in the Color Index (C.I.) Handbook, "Latest Pigment Handbook" (edited by the Japan Pigment Technical Association, published in 1977), "Latest Pigment Applied Technology" (CMC publications, published in 1986) and "Printing Ink Technology" (CMC publications, published in 1984).

The types of pigment which can be used include black pigments, yellow pigments, orange pigments, brown pigments, red pigments, violet pigments, blue pigments, green pigments, fluorescent pigments, metallic powdery pigments, or polymer bonded colorants. Specific examples are insoluble azo pigments, azo lake pigments, condensed azo pigments, chelate azo pigments, phthalocyanine-based pigments, anthraquinone-based pigments, perylene or perinone-based pigments, thioindigo-based pigments, quinacridone-based pigments, dioxazine-based pigments, isoindolinone-based pigments, quinophthalone-based pigments, lake pigments, azine pigments, nitroso pigments, nitro pigments, natural pigments, fluorescent pigments, inorganic pigments, carbon black and the like. Among these pigments, carbon black is preferable.

These pigments may be used with or without being subjected to surface processing. Methods for surface processing include applying a surface coat of resin or wax, applying surfactant, and bonding a reactive material (for example, a silane coupling agent, an epoxy compound, polyisocyanate, or the like) to the surface of the pigment particle. These methods for surface processing are described in "Properties and Application of Metallic Soap" (published by Saiwai Shobo), "Printing InkTechnology" (CMC Publications, published in 1984) and "Latest Pigment Applied Technology" (CMC Publications, published in 1986).

The particle size of the pigment is preferably from 0.01 to 10 μm, more preferably from 0.05 to 1 μm and especially preferably from 0.1 to 1 μm. A particle size of the pigment of less than 0.01 μm is not preferred because of deteriorated stability of the dispersed pigment in a photosensitive layer coating liquid. A particle size of more than 10 μm is not preferred, either, because of deteriorated uniformity of the photosensitive layer.

As the method for dispersing the pigment, any known dispersing techniques which are used for the production of ink, toner or the like may be used. Dispersing devices for the dispersion include an ultrasonic dispersing device, a sand mill, an attritor, a pearl mill, a super mill, a ball mill, an impeller, a disperser, a KD mill, a colloid mill, a dynatron, a three-roll mill, and a press kneader. Details thereof are described in "Latest Pigment Applied Technology" (CMC Publications, published in 1986).

The amounts of these dyes or pigments based on the total amount of solid components added to the materials constituting a photosensitive layer of the planographic printing material is preferably from 0.01 to 50% by weight, and more preferably from 0.1 to 10% by weight. A dye can be added particularly preferably in an amount of 0.5 to 10% by weight, and a pigment can be added particularly preferably in an amount of 1.0 to 10% by weight, to materials constituting a photosensitive layer of the planographic printing material. When the amount added of a pigment or a dye is less than 0.01% by weight, the effect of improving sensitivity is not sufficient, whereas, when over 50% by weight, non-image areas tend to be smudged in printing.

These dyes and/or pigments may be added to the same layer together with other components, or another layer may be provided to which the dyes and/or pigments are added. Among the above-described dyes or pigments, those absorbing infrared rays or near-infrared rays are particularly preferable. The dyes and/or pigments may be used in combinations of two or more.

Various additives can be added to the materials constituting a photosensitive layer of the positive planographic printing material of the present invention. For example, other onium salts, aromatic sulfone compounds, aromatic sulfonic ester compounds and the like are preferable since when these substances are added, the ability to suppress the dissolution of image areas into a developing solution can be improved because such substances act as a heat decomposable substance.

Examples of the above-described onium salts include diazonium salt, ammonium salt, phosphonium salt, iodonium salt, sulfonium salt, selenonium salt and arsonium salt or the like. Preferred onium salts which can be used in the present embodiment are, for example, the diazonium salts described in S. I. Schlesinger, Photogr. Sci. Eng., 18, 387 (1974), T. S. Bal et al., Polymer, 21 423 (1980), and JP-A No. 5-158230; the ammonium salts described in U.S. Pat. Nos. 4,069,055and 4,069,056, or JP-A No. 3-140140; the phosphonium salts described in D. C. Necker et al., Macromolecules, 17, 2468 (1984), C. S. Wen et al., The. Proc. Conf. Rad. Curing ASIA, P.478, Tokyo, (October 1988), the iodonium salts described in J. V. Crivello et al., Macromolecules, 10(6), 1307 (1977), Chem. & Eng. News, P. 31, (November 28, 1988) EP No. 104,143, U.S. Pat. Nos. 339,049, 410,210, JP-A Nos. 2-150848 and 2-296514; the sulfonium salts described in J. V. Crivello et al., Polymer J. 17, 73 (1985), J. V. Crivello et al., J. Org. Chem., 43 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromolecules, 14(5), 1141 (1981), J. V. Crivello et al., J. Polymer Sci., Polymer Chem.Ed., 17, 2877 (1979), EP Nos. 370,693, 233,567, 297,443, 297,442, U.S. Pat. Nos. 4,933,377, 3,902,114, 410,201, 339,049, 4,760,013, 4,760,013, 4,734,444, 2,833, 827, German Patent Nos. 2,904,626, 3,604,580, 3,604,581; the selenonium salts described in J. V. Crivello et al., Macromolecules, 10(6), 1307 (1977), J. V. Crivello et al., J. Polymer Sci., Polymer Chem. Ed., 17, 1047 (1979); and the arsonium salts described in C. S. Wen et al., The, Proc. Conf. Rad. Curing ASIA, P. 478, Tokyo, (Oct. 1988).

The counter ion of the onium salt may be tetrafluoroboric acid, hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4, 6-trimethylbenzensulfonic acid, 2-nitrobenzensulfonic acid, 3-chlorobenzenesulfonic acid, 3-bromobenzensulfonic acid, 2-fluorocaprylnaphthalenesulfonic acid, dodecylbenzensulfonic acid, 1-naphthol-5-sulfonic acid, 2-methoxy-4-hydroxy-5-benzoyl-benzenesulfonic acid, and p-toluenesulfonic acid.

Among these, preferred are alkylaromatic sulfonic acids such as hexafluorophosphoric acid, triisopropylnaphthalenesulfonic acid and 2,5-dimethylbenzenesulfonic acid.

The amount of added onium salt based on the total amount of solid components in materials constituting a photosensitive layer in the planographic printing material is preferably from 1 to 50% by weight, more preferably from 5 to 30% by weight, and especially preferably from 10 to 30% by weight.

A dye having large absorption in the visible light range can be used as a coloring agent for images. As preferable dyes, oil-soluble dyes and basic dyes are listed.

Specific examples thereof include Oil-Yellow #101, Oil-Yellow #103, Oil-Pink #312, Oil Green BG, Oil Blue BOS, Oil Blue #603, Oil Black BY, Oil Black BS, Oil Black T-505 (all of which are manufactured by Orient Chemical Industries Co., Ltd.), Victoria Pure Blue, Crystal Violet (CI 42555), Methyl Violet (CI 42535), Ethyl Violet, Rhodamine B (CI 145170B), Malachite Green (CI 42000), Methylene Blue (CI 52015), Aizen Spiron Blue C-RH (manufactured by Hodogaya Chemicals, Ltd.) and dyes disclosed in JP-A No. 62-293247, and the like.

The addition of these dyes is preferable since then discrimination between image areas and non-image areas after formation of images becomes clear. The amount added thereof is preferably in the range of from 0.01 to 10% by weight based on the total amount of solid components in the material constituting a photosensitive layer of the planographic printing material.

Cyclic acid anhydrides, phenols and organic acids may be used to further improve sensitivity. Examples of the cyclic acid anhydrides include phthalic anhydride, tetrahydrophthalic anhydride, hexahydrophthalic anhydride, 3,6-endooxy-$\Delta^4$-tetrahydrophthalic anhydride, tetrachlorophthalic anhydride, maleic anhydride, chloromaleic anhydride, $\alpha$-phenylmaleic anhydride, succinic anhydride, pyromellitic anhydride or the like which are disclosed in U.S. Pat. No. 4,115,128.

Examples of the phenols include bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane, and 4,4',3", 4"-tetrahydroxy-3,5,3',5'-tetramethyltriphenylmethane or the like.

Examples of the organic acids include sulfonic acids, sulfinic acids, alkylsulfuric acids, phosphonic acids, phosphoric esters and carboxylic acids or the like as described in JP-A Nos. 60-88942 and 2-96755, and specifically include p-toluenesulfonicacid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecylic acid, ascorbic acid, and the like.

The proportions of the above-described cyclic acid anhydrides, phenols and organic acids in the total amount of solid components in the materials constituting a photosensitive layer of the planographic printing material is preferably from 0. 05 to 20% by weight, more preferably from 0.1 to 15% by weight, and particularly preferably from 0.1 to 10% by weight.

A nonionic surfactant as described in JP-A Nos. 62-251740 and 3-208514, or an amophoteric surfactant as described in JP-A Nos. 59-121044 and 4-13149 may be added to the materials constituting a photosensitive layer of the planographic printing material of the present invention, in order to ensure stable processing for different developing solution conditions.

Specific examples of the nonionic surfactant include sorbitan tristearate, sorbitan monopalmitate, sorbitan trioleate, monoglyceride stearate, and polyoxyethylene nonylphenyl ether.

Specific examples of the amphoteric surfactant include alkyldi(aminoethyl)glycine, alkylpolyaminoethylglycine hydrochloride, 2-alkyl-N-carboxyethyl-N-hydroxyethylimidazolynium betaine and N-tetradecyl-N,N-betaine (e.g. trade name: Amogen K, manufacture by Daiichi Kogyo K.K.).

The proportions of the above-described non-ionic surfactants and amphoteric surfactants in the total amount of solid components in the materials constituting a photosensitive layer of the planographic printing material is preferably from 0.05 to 15% by weight, and more preferably from 0.1 to 5% by weight.

A printout agent for obtaining a visual image directly after heating by exposure and a dye or pigment as an image coloring agent can be added to the materials constituting a photosensitive layer of the positive planographic printing material of the present invention.

As the printout agent, a combination of a compound which releases an acid due to heating by exposure to light (photosensitive acid-releasing agent) with an organic dye which can form a salt may be listed as typical examples. Specific examples of the printout agent include a combination of o-naphthoquinonediazide-4-sulfonic halogenide and a salt-forming organic dye which combination is described in JP-A Nos. 50-36209 and 53-8128, and a combination of a trihalomethyl compound and a salt-forming organic dye which combination is described in JP-A Nos. 53-36223, 54-74728, 60-3626, 61-143748, 61-151644 and 63-58440. These trihalomethyl compounds include oxazole-based compounds and triazine-based compounds. Both have excellent stability over time so as to provide clear printout images.

The addition of epoxy compounds, vinyl ether compounds, phenol compounds having a hydroxymethyl group or alkoxymethyl group described in Japanese Patent Application No. 7-18120, and cross-linkable compounds having suppressing action to an alkali solution described in Japanese Patent Application No. 9-3288937 is preferable from the standpoint of storage stability.

A plasticizer for providing the formed film with softness may be optionally added to the materials constituting a photosensitive layer of the positive planographic printing material of the present invention. Examples of the plasticizer which may be used include butylphthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomer or polymer of arylic acid or methacrylic acid.

A surfactant for improving coating property, for example, a fluorine-based surfactant as described in JP-A No. 62-170950 can be added to material constituting a photosensitive layer of the positive planographic printing material of the present invention. The amount added is preferably from 0.01 to 1% by weight, and more preferably from 0.05 to 0.5% by weight based on the total weight of the planographic printing material.

A positive planographic printing plate can be produced according to a general method for producing the planographic printing plate described below using the positive planographic printing material of the present invention.

A planographic printing plate can generally be produced by dissolving the materials constituting a photosensitive layer of the positive planographic printing material of the present invention composed of the above-described components in a solvent and coating the solution onto an appropriate substrate. Examples of the solvent used here include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetoamide, N,N-dimethylformamide, tetramethylurea, N-methylpyrrolidone, dimethylsulfoxide, sulfolane, γ-butyrolactone, toluene and the like. However, the solvent is not limited to these examples. The solvent may be used alone, or a combination of two or more of these solvents can be used. The concentration of the aforementioned components (i.e., all of the solid components including the additives) in the solvent is preferably from 1 to50% by weight. The amount (of the solid components) of the coating on the substrate obtained after coating and drying may vary depending on the purpose of use, but in general, it is preferably from 0.5 to 5.0 g/$m^2$ for the photosensitive printing plate.

The method for applying the solution may be any of various methods, for example, bar coater coating, rotating coating, spray coating, curtain coating, dip coating, air knife coating, blade coating, and roll coating. The less the amount applied to the substrate, the higher the apparent sensitivity, but the worse the film characteristics of the photosensitive film. This coated layer is the photosensitive layer in the planographic printing plate.

The substrate which is used in the present embodiment is a plate-like object having stable dimensions, and may be, for example, paper; paper on which plastic such as polyethylene, polypropylene, polystyrene or the like is laminated; a metal plate such as an aluminum, zinc or copper plate; a plastic film formed of, for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, or polyvinyl acetal; a paper or a plastic film on which the aforementioned metal is vapor-deposited or laminated; or the like.

As the substrate in the present invention, a polyester film or an aluminum plate is preferred, and an aluminum plate is especially preferred because of its stable dimensions and relatively low cost. A preferable aluminum plate is a pure aluminum plate or is an alloy plate comprising aluminum as the main component and a very small amount of a different element. A plastic film on which aluminum is laminated or vapor-deposited may be used. Examples of the different elements which may be contained in the aluminum alloy are silicon, iron, manganese, copper, magnesium, chromium, zinc, bismuth, nickel, titanium, and the like. The content of the different elements in the alloy is to be 10% by weight or less. As described above, an especially preferable aluminum in the present embodiment is pure aluminum, however, from the standpoint of refining techniques, it is difficult to prepare a completely pure aluminum. Therefore, an aluminum containing a very small amount of different elements may be used. In short, the composition of the aluminum plate applied to the present embodiment is not specified, and the aluminum plate may be any conventionally known aluminum plate.

The thickness of the aluminum plate used in the present embodiment is from about 0.1 to 0.6 mm, preferably from 0.15 to 0.4 mm, and especially preferably from 0.2 to 0.3 mm.

The aluminum plate is utilized after surface roughening. Before making the surface of the aluminum plate rough, if desired, the surface may be subjected to a degreasing processing with, for example, a surfactant, organic solvent or aqueous alkali solution, to remove rolling oil from the surface.

The processing for roughening the surface of the aluminum plate may be carried out in any of various ways such as, for example, a method of mechanically roughening the surface, a method of electrochemically melting the surface and making it rough, and a method of chemically and selectively melting the surface. The mechanical method may be any known method such as ball polishing, brush polishing, blast polishing, buff polishing, or the like. The electrochemical method of making the surface rough may be a method of applying alternating or direct current to the surface in an electrolytic solution of hydrochloric acid or nitric acid. A combination of both mechanical and electrochemical methods may be used, as disclosed in JP-A No. 54-63902.

The aluminum plate whose surface has been roughened as described above may optionally be subjected to an alkali etching processing and a neutralizing processing, and then, if desired, is subjected to an anodic oxidization processing for improving the water holding property and wear resistance of the surface. The electrolyte which is used in the anodic oxidization processing of the aluminum plate may be any of various electrolytes which can form a porous oxidized film, and in general, sulfuric acid, phosphoric acid, oxalic acid, chromic acid, or mixtures thereof may be used. The concentration of the electrolyte is determined appropriately in accordance with the type of electrolyte.

The anodic oxidization processing conditions cannot be specified because they vary in accordance with the type of electrolyte. In general, however, it is appropriate for the concentration of the electrolyte in the solution to be from 1 to 80% by weight, the temperature of the solution to be from 5 to 70° C., the current density to be from 5 to 60 A/$dm^2$, the voltage to be from 1 to 100 V, and the time for the electrolysis to be from 10 seconds to 5 minutes. If the amount of the anodically oxidized film is less than 1.0 g/$m^2$, the wear resistance of the plate is insufficient, or it is easy for scratches to be formed at the non-image portions on the planographic printing plate. This results in so-called "scratch stains" being easily formed, i.e., ink adheres to the scratches at the time of printing.

After being subjected to the anodic oxidization processing, the surface of the aluminum is optionally subjected to a hydrophilization processing. The hydrophilization processing which is used in the present invention may be an alkali metal silicate (e.g., an aqueous solution of sodium silicate) process as disclosed in U.S. Pat. Nos. 2,714,066, 3,181,461, 3,280,734 and 3,902,734. In this process, the substrate is dipped in an aqueous solution of sodium silicate, or is electrolyzed therein. Alternatively, it is possible to use the processes of processing the surface with potassium fluorozirconate as described in JP-B No. 36-22063, or with polyvinylphosphonic acid as disclosed in U.S. Pat. Nos. 3,276,868, 4,153,461 and 4,689,272.

An undercoat layer may be provided between the substrate and the photosensitive layer as needed. Various organic compounds may be used as the undercoat layer components, such as carboxymethylcellulose, dextrin, gum arabic, phosphonic acids having an amino group such as 2-aminoethylphosphonic acid, organic phosphonic acids such as phenylphosphonic acid, naphthylphosphonic acid, alkylphosphonic acid, glycerophosphonic acid, methylenediphosphonic acid and ethylenediphosphonic acid, each of which may have one or more substituents, organic phosphoric acids such as phenylphosphoric acid, naphthylphosphoric acid, alkylphosphoric acid and glycerophosphoric acid, each of which may have one or more substituents, organic phosphinic acids such as phenylphosphinic acid, naphthylphosphinic acid, alkylphosphinic acid and glycerophosphinic acid, each of which may have one or more substituents; amino acids such as glycine and β-alanine; and a hydrochloride of an amine having a hydroxy group such as hydrochloride of triethanol amine. They may be used singly and may also be used in combinations of two or more.

In the present invention, the polyfunctional amine compound which is an essential constituent component of the present invention can also be added to an undercoat as is previously known. In this case, the undercoat layer may be formed together with the above-described other organic compounds and may be formed only with the polyfunctional amine compound.

The undercoat layer can be formed by either of the following methods: a method of coating and drying on the aluminum plate a solution in which the aforementioned organic compound and/or a polyfunctional amine compound is dissolved in water or in an organic solvent such as methanol, ethanol or methyl ethyl ketone, or a mixed solution thereof; or a method the aluminum is dipped plate into a solution in which the aforementioned organic compound and/or a polyfunctional amine compound is dissolved in water or an organic solvent such as methanol, ethanol or methyl ethyl ketone, or a mixed solution thereof so as to cause the plate to absorb the aforementioned compound, and then the plate is washed with water or the like and dried so as to form the undercoat layer. In the former method, a solution having a concentration of the aforementioned organic compound and/or a polyfunctional amine compound of from 0.005 to 10% by weight can be applied in any of various manners. In the latter method, the concentration of the solution is from 0.01 to 20% by weight, and preferably from 0.05 to 5% by weight, the dipping temperature is from 20 to 90° C., and preferably from 25 to 50° C., and the dipping time is from 0.1 second to 20 minutes, and preferably from 2 seconds to 1 minute. The value of the pH of the solution used herein can be adjusted within the range of from 1 to 12, using basic substances such as ammonia, triethylamine or potassium hydroxide, or acidic substances such as hydrochloric acid or phosphoric acid. A yellow dye may be added to the solution to improve tone reproducibility of the planographic printing materials.

The coating amount of the undercoat layer is suitably from 2 to 200 mg/$m^2$, and preferably from 5 to 100 mg/$m^2$. If the coating amount is less than 2 mg/$m^2$ or more than 200 mg/$m^2$, sufficient wear resistance of the plate might not be obtained.

A manufactured planographic printing plate is usually subjected to image-exposure and development processing to form images. The light source for the active light used in the image-exposure maybe, for example, a mercury lamp, a metal halide lamp, a xenon lamp, a chemical lamp, a carbon arc lamp or the like. Examples of radiation which can be used in the present invention include an electron beam, an X ray, an ion beam, and a far infrared ray or the like. Moreover, a g-line, an i-line, a deep-UV light, or a high density energy beam (a laser beam) may also be used. The laser beam may be a helium/neon laser, an argon laser, a krypton laser, a helium/cadmium laser, and a KrF excimer laser or the like. In the present invention, a light source emitting light having luminous wavelength within the range from the near infrared wavelength region to the infrared wavelength region is preferred, and especially preferred is a solid state laser or a semiconductor laser.

The developing solution and replenishing solution used in the present embodiment may be a conventionally known aqueous alkali solution such as, for example, solutions of inorganic alkali salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide, and lithium hydroxide; and organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine.

These alkali agents may be used alone, or a combination of two or more may be used.

Among these alkali agents, especially preferred developing solutions are aqueous solutions of silicates, such as sodium silicate and potassium silicate. This is because developability can be adjusted by altering the ratio of silicon dioxide ($SiO_2$) and alkali metal oxide $M_2O$ (M represents alkali metal) and/or the concentrations of silicon dioxide and the alkali metal oxides. For example, alkali metal salts of silicic acid as described in JP-A No. 54-62004 and JP-B No. 57-7427 are effectively used.

It is known that when development is carried out using an automatic developing machine, an aqueous solution (a replenishing solution) having a higher alkalinity than the developing solution is added to the developing solution so that a large number of planographic printing plates can be processed without having to replace the developing solution in the developing tank for a long time. In the present invention, this type of replenishing method is preferably used. Various surfactants or organic solvents may be optionally added to the developing solution and the replenishing solution to accelerate or control developability, to improve the dispersibility of development-scum, and to improve the affinity of image portions on the printing plate with ink. The surfactant is preferably an anionic, cationic, nonionic, or amphoteric surfactant. A reducing agent such as hydroquinone, resorcin, a sodium salt or potassium salt of an inorganic acid such as sulfurous acid or sulfurous hydracid; an organic carboxylic acid; and antifoamer, or a hard-water softener may be added to the developing solution and the replenishing solution as needed.

The planographic printing plate developed using the above developing solution and replenishing solution is post-processed with washing water, a rinsing solution containing, for example, a surfactant, and a desensitizing solution containing gum arabic or a starch derivative. Various combinations of these processings can be used as the post-processing carried out when the planographic printing material of the present invention is used as a printing plate.

In recent years, in the printing plate manufacturing and printing industries, in order to rationalize and standardize plate manufacturing, automatic developing machines for printing plates have been widely used. Planographic printing plates using the printing material of the present invention are also able to undergo processing in these developing machine. These automatic developing machine generally comprise a developing section and a post-processing section, and comprise a device for conveying a printing plate, tanks for various processing solutions, and a spray device. Various processing solutions pumped up by a pump are sprayed on an exposed printing plate from spray nozzles while the plate is transported horizontally, so as to develop the printing plate. Recently, there has also become known a method in which a printing plate is processed by being immersed and conveyed in tanks filled with processing solutions by means of guide rolls or the like disposed in the solutions. Such automatic processing may be carried out while replenishing solutions are being replenished into the respective processing solutions in accordance with the processed amount or the working time. A so-called disposable processing method, in which processing is carried out with processing solutions which are virtually unused, can be used.

When unneeded image portion (for example, traces of the film edges of the original film) are present on a planographic printing plate which has undergone image exposure, developing, and washing and/or rinsing and/or gum coating processes, such unnecessary image portions are removed. It is preferable that the removal is carried out by applying a removing solution such as that described in JP-B No. 2-13293 to the unnecessary image portions, allowing the printing plate to stand for a given period, and then washing the printing plate with water. However, the method disclosed in JP-A No. 59-174842 may be used, in which the unnecessary image portions are irradiated with an active light beam guided through an optical fiber, and the printing plate is developed thereafter.

The planographic printing plate which has undergone the above processings and which, if so desired, has been coated with desensitizing rubber, can be subjected to the printing process. If a planographic printing plate with a greater printing durability is desired, the plate may be subjected to a burning processing. When a burning processing is performed on the planographic printing plate, it is preferable that the plate be processed with a surface-adjusting solution such as those disclosed in JP-B Nos. 61-2518 and 55-28062, and JP-A Nos. 62-31859 and 61-159655, before the burning processing. Examples of methods of processing the planographic printing plate with a surface-adjusting solution include a method of applying the surface-adjusting solution to the planographic printing plate with a sponge or absorbent cotton which has been soaked in the surface-adjusting solution, a method of immersing the printing plate into a vat filled with the surface-adjusting solution to coat the plate with the solution, and a method of applying the surface-adjusting solution with an automatic coater. Better results can be obtained if the amount of the surface-adjusting solution is made uniform over the entire surface of the plate with a squeegee or squeegee rollers. An appropriate amount of the applied surface-adjusting solution is generally from 0.03 to 0.8 $g/m^2$ (dry weight).

The planographic printing plate processed with the surface-adjusting solution is dried and, if necessary, is heated to high temperature with a burning processor, for example, a "BP-1300"burning processor sold by Fuji Photo Film Co., Ltd. The heating temperature and the heating time in this step depend on the type of components forming the image, but are preferably from 180 to 300° C. and 1 to 20 minutes, respectively.

If necessary, the planographic printing plate subjected to the burning processing may further be subjected to conventional processings such as washing with water and gumm-coating. However, if a surface-adjusting solution containing a water-soluble polymer compound or the like is used, a desensitizing processing such as the rubber-coating can be omitted.

The planographic printing plate obtained by the above proccesings is set in an offset printing machine or the like, and is used for printing paper and the like.

EXAMPLES

The following examples further illustrate the present invention in detail, but do not limit the scope of the present invention.

Synthesis of Polymer which is Water-insoluble and Aqueous Alkali Solution-soluble

Synthesis of Copolymer P

Into a 500 ml three-necked flask equipped with a stirrer, cooling tube and dropping funnel was charged 31.0 g (0.36 mol) of methacrylic acid, 39.1 g (0.36 mol) of ethyl chloroformate and 200 ml of acetonitrile and the mixture thereof was stirred while cooling with an ice-water bath. To this mixture was added dropwise 36.4 g (0.36 mol) of triethylamine through a dropping funnel over approximately 1 hour. After the completion of the addition, the ice-water bath was removed, and the mixture was stirred for 30 minutes at room temperature.

To this reaction mixture, 51.7 g (0.30 mol) of p-aminobenzenesulfonamide was added. The mixture was stirred for 1 hour while being warmed in a hot bath to 70° C. After the completion of the reaction, the resulting mixture was added to 1 L of water while this water was stirred, and the resulting mixture was stirred for 30 minutes. This mixture was filtrated to obtain a precipitate, and 500 ml of water was added to the precipitate to prepare slurry. This slurry was then filtrated, and the resulting solid was dried to obtain a white solid of N-(p-aminosulfonylphenyl) methacrylamide (yield: 46.9 g).

Then, into a 100 ml three-necked flask equipped with a stirrer, cooling tube and dropping funnel was charged 5.04 g (0.0210 mol) of N- (p-aminosulfonylphenyl) methacrylamide, 2.05 g (0.0180 mol) of ethyl methacrylate, 1.11 g (0.021 mol) of acrylonitrile and 20 g of N,N-dimethylacetamide, and the mixture was stirred while being heated in a hot bath to 65° C. To this mixture was added 0.15 g of 2,2'-azobis( 2,4-dimethylvaleronitrile)(trade name: V-65, manufactured by Wako Pure Chemical Industries Ltd.) as a radical polymerization initiator and the mixture was stirred for 2 hours under nitrogen flow while the temperature thereof was maintained at 65° C. To this reaction mixture was further added dropwise a mixture of 5.04 g of N-(p-aminosulfonylphenyl)methacrylamide, 2.05 g of ethyl methacrylate, 1.11 g of acrylonitrile, 20 g of N,N-dimethylacetamide and 0.15 g of the above-described V-65 through a dropping funnel over a period of 2 hours. After the completion of the addition, the resulting mixture was further stirred for 2 hours at 65° C. After the completion of the reaction, 40 g of methanol was added to the mixture and the resulting mixture was cooled and added into 2 L of water while this water was stirred, and the mixture was stirred for 30 minutes. The precipitate was then removed by filtration and dried to obtain 15 g of a copolymer P as white solid.

The weight-average molecular weight (polystyrene standard) of this copolymer P was measured by gel permeation chromatography and was found to be $5.3 \times 10^4$.

Examples 1 to 5

Photosensitive solutions 1 having the following composition were prepared.

| <Composition of photosensitive solutions 1> | |
|---|---|
| Polyfunctional amine compound shown in Table 1 below (any of A to E) | 0.10 g |
| Infrared absorber (IR-1) | 0.20 g |
| m,p-Cresol novolak (m/p ratio = 6/4, weight-average molecular weight 3500, containing 0.5% by weight of unreacted cresol) | 1.0 g |
| Dye in which counter anion of Victoria Pure Blue BOH has been changed to 1-naphthalenesulfonic acid anion | 0.02 g |
| Fluorine-based surfactant (Megafack F-177, manufactured by Dainippon Ink & Chemicals, Inc.) | 0.05 g |
| γ-Butyrolactone | 3.0 g |
| Methyl ethyl ketone | 8.0 g |
| 1-Methoxy-2-propanol | 7.0 g |

[IR-1]

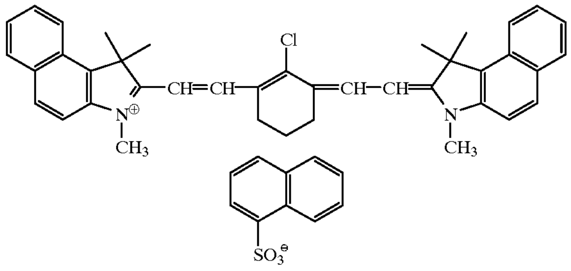

TABLE 1

| | Type of polyfunctional amine compound |
|---|---|
| Example 1 | A |
| Example 2 | B |
| Example 3 | C |
| Example 4 | D |
| Example 5 | E |

The polyfunctional amine compounds A to E in Table 1 above are represented by the following structural formulas respectively.

A

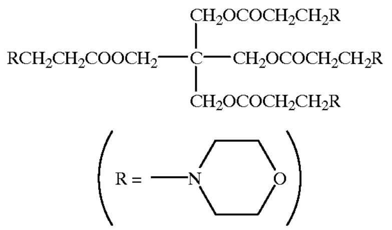

B $H_2NCH_2CH_2OCH_2CH_2NH_2$

C

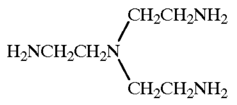

-continued

D

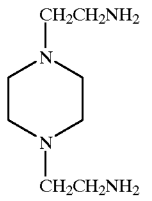

E

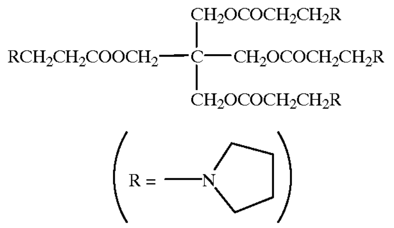

Production of Substrate

An aluminum plate (material 1050) having a thickness of 0.3 mm was degreased by being washed with trichloroethylene, then, the surface of this plate was grained using a nylon brush and a 400 mesh pumice-water suspension and washed thoroughly with water. This aluminum plate was etched by being immersed into a 25% aqueous sodium hydroxide solution at 45° C. for 9 seconds, washed with water, then, further immersed into a 20% nitric acid solution for 20 seconds and washed with water. The amount etched on the grained surface at this point was approximately 3 $g/m^2$. Next, a anodized film of 3 $g/m^2$ was made on this aluminum plate using a 7% sulfuric acid solution as an electrolysis solution at a current density of 15 $A/dm^2$ The plate was then washed with water and dried, and an undercoat solution A described below was applied, and the resulting coated film was dried for one minute at 90° C. The amount applied of the coated film after drying was 10 $mg/m^2$. (Composition of undercoat solution A)

| | |
|---|---|
| β-Alanine | 0.50 g |
| Methanol | 95 g |
| Water | 5.0 g |

On the undercoat layers of the substrates thus produced were applied the above-described photosensitive solutions 1 respectively so that the amount applied after drying was 1.8 $g/m^2$, to obtain planographic printing plates. These are Examples 1 to 5.

Comparative Example 1

A photosensitive solution H1 was prepared in the same manner as in Examples 1 to 5 except that a polyfunctional amine compound of the present invention was not added in the preparation of the above-described photosensitive solution 1. A planographic printing plate was produced in the same manner as in Examples 1 to 5 except that the resulting photosensitive solution H1 was used. This is Comparative Example 1.

Comparative Example 2

A photosensitive solution H2 was prepared in the same manner as in Examples 1 to 5 except that ethanolamine was used instead of the polyfunctional amine compound of the present invention in the preparation of the above-described photosensitive solution 1. A planographic printing plate was produced in the same manner as in Examples 1 to 5 except that the resulting photosensitive solution H2 was used. This is Comparative Example 2.

Comparative Example 3

A photosensitive solution H3 was prepared in the same manner as in Examples 1 to 5 except that tri-n-butylamine was used instead of the polyfunctional amine compound of the present invention in the preparation of the above-described photosensitive solution 1. A planographic printing plate was produced in the same manner as in Examples 1 to 5 except that the resulting photosensitive solution H3 was used. This is Comparative Example 3.

Examples 6 to 10

Photosensitive solutions 2 having the following composition were prepared.

| <Composition of photosensitive solution 2> | |
|---|---|
| Polyfunctional amine compound shown in Table 2 below (any of A to E) | 0.10 g |
| Infrared absorber (IR-2) | 0.20 g |
| Copolymer P synthesized by the above-described method | 0.7 g |
| m,p-cresol novolak used in Examples 1 to 5 | 0.3 g |
| Dye in which counter anion of Victoria Pure Blue BOH has been changed to 1-naphthalenesulfonic acid anion | 0.02 g |
| Fluorine-based surfactant (Megafack F-177, manufactured by Dainippon Ink & Chemicals, Inc.) | 0.05 g |
| γ-Butyrolactone | 3.0 g |
| Methyl ethyl ketone | 8.0 g |
| 1-Methoxy-2-propanol | 7.0 g |

[IR-2]

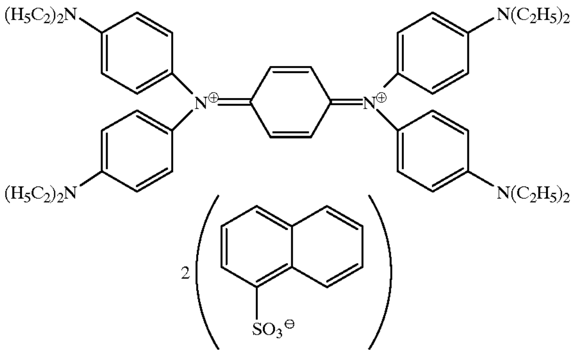

TABLE 2

| | Type of polyfunctional amine compound |
|---|---|
| Example 6 | A |
| Example 7 | B |
| Example 8 | C |
| Example 9 | D |
| Example 10 | E |

Note that the polyfunctional amine compounds A to E in Table 2 are respectively the same as those described above Table 1.

On the substrates as produced in Examples 1 to 5 were applied the above-described photosensitive solutions 2 respectively so that the amount applied after drying was 1.8 $g/m^2$, to obtain planographic printing plates. These are Examples 6 to 10.

Comparative Example 4

A photosensitive solution H4 was prepared in the same manner as in Examples 6 to 10 except that a polyfunctional amine compound of the present invention was not added to the photosensitive solution H4 in the preparation of the above-described photosensitive solutions 2. A planographic printing plate was produced in the same manner as in Examples 6 to 10 except that the resulting photosensitive solution H4 was used. This is Comparative Example 4.

Comparative Example 5

A photosensitive solution H5 was prepared in the same manner as in Examples 6 to 10 except that ethanolamine was used instead of the polyfunctional amine compound of the present invention in the preparation of the above-described photosensitive solutions 2. A planographic printing plate was produced in the same manner as in Examples 6 to 10 except that the resulting photosensitive solution H5 was used. This is Comparative Example 5.

Comparative Example 6

A photosensitive solution H6 was prepared in the same manner as in Examples 6 to 10 except that tri-n-butylamine was used instead of the polyfunctional amine compound of the present invention in the preparation of the above-described photosensitive solutions 1. A planographic printing plate was produced in the same manner as in Examples 6 to 10 except that the resulting photosensitive solution H6 was used. This is Comparative Example 6.

Example 11

An undercoat solution B having the following composition was prepared.

Composition of Undercoat Solution B

| | |
|---|---|
| The above-described polyfunctional amine compound A | 1.0 g |
| Methanol | 70 g |

A substrate was produced in the same manner as the substrates produced in <Production of substrate> in Examples 1 to 5except the undercoat solution A was changed to the undercoat solution B and the amount applied after drying was changed to 22 mg/$m^2$,.

Then, on the undercoat layer of the substrate thus produced was applied the above-described photosensitive solution 1 so that the amount applied after drying was 1.8 g/$m^2$, to obtain a planographic printing plate. This is Example 11.

Example 12

On the undercoat layer of the substrate produced in Example 11 was applied the above-described photosensitive solution H4 produced in Comparative Example 4 so that the amount applied after drying was 1.8 g/$m^2$, to obtain a planographic printing plate. This is Example 12.

Examples 13 to 16

Photosensitive solutions 3 were prepared in the same manner as in the preparation of the photosensitive solution 1 (using polyfunctional amine compound E) in Example except that the infrared absorber IR-1 was changed respectively to IR-3 - IR-6 as shown below. Planographic printing plates were produced in the same manner as in Example 5 except that the resulting photosensitive solution 3 was used. These are Examples 13 to 16.

TABLE 3

| | Kind of infrared absorber |
|---|---|
| Example 13 | IR-3 |
| Example 14 | IR-4 |
| Example 15 | IR-5 |
| Example 16 | IR-6 |

IR-3

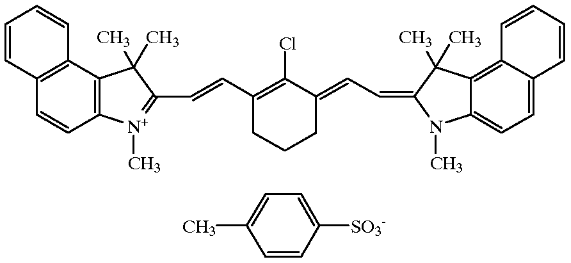

IR-4

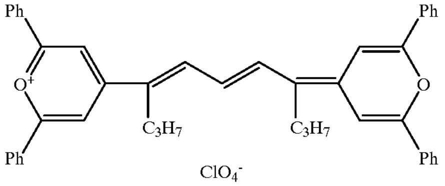

IR-5

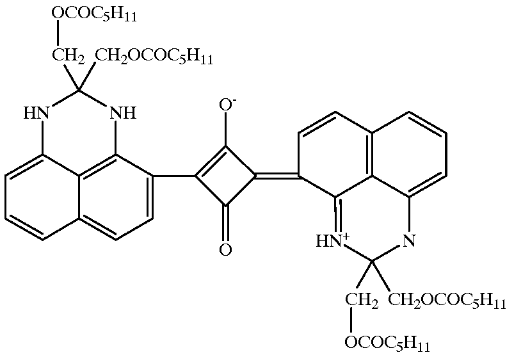

IR-6

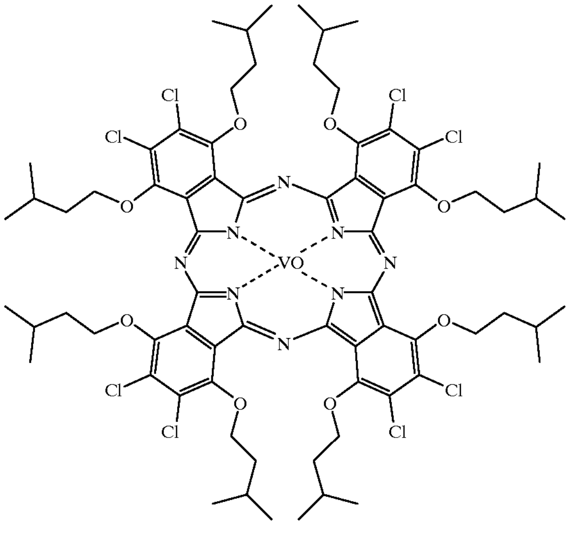

The planeographic printing plates as produced in Examples 1 to 16 and Comparative Examples 1 to 6 were evaluated for performance based on the following standards.

Evaluation of Sensitivity and Development Latitude

The planographic printing plates as produced in Examples 1 to 16 and Comparative Examples 1 to 6 were exposed using a semiconductor laser with a wavelength of 840 nm or a YAG laser of a wavelength with 1064 nm as shown in Table 4 below. The lasers were selected appropriately as shown in Table 4 depending on the absorption wavelength of the infrared absorber contained in each plate. After the exposure, they were developed using an automatic developing machine ("PS processor 900 VR", manufactured by Fuji Photo Film Co., Ltd.) in which a developing solution DP-4 and a rinsing solution FR-3 (1:7) manufactured by Fuji Photo Film Co., Ltd. had been charged. Two types of developing solutions DP-4 which had been diluted at 1:6 and 1:12 were prepared.

The line width of non-image areas obtained by using the developing solution DP-4 which had been diluted at 1:6 was measured, and the irradiation energy of a laser corresponding to the line width was calculated and used as an index of sensitivity ($mJ/cm^2$). The smaller this measured value ($mJ/cm^2$), the higher the sensitivity of the planographic printing plate.

Next, the line widths of non-image areas obtained by using the standard developing solution DP-4 which had been diluted at 1:6 and the more diluted developing solution DP-4 which had been diluted at 1:12 were measured, and the irradiation energies of lasers corresponding to the line widths were calculated and the difference in sensitivities thereof was used as an index of development latitude. The smaller the difference, the better the development latitude. A development latitude of 20 $mJ/cm^2$ or less is suitable for practical use.

Evaluation of Storage Stability

The planographic printing plates in Examples 1 to 16 and Comparative Examples 1 to 6 were stored for 3 days at 60° C. under a relative humidity of 45%, then, the laser exposure and development were conducted in the same manner as described above, and sensitivities were calculated in the same manner (using developing solution DP-4 diluted at 1:6), and compared with the results obtained above and the difference was calculated for use as an index of the storage stability. When the variation in the sensitivity is 20 $mJ/cm^2$ or less, the storage stability is excellent and suitable for practical use.

The results of the above-described evaluations are shown in Table 4.

TABLE 4

| | Type of (polyfunctional) amine compound | Type of infrared absorber | Exposure wavelength (nm) | Sensitivity ($mJ/cm^2$) | Development latitude ($mJ/cm^2$) | Storage stability ($mJ/cm^2$) |
|---|---|---|---|---|---|---|
| Example 1 | A | IR-1 | 840 | 120 | 5 | 5 |
| Example 2 | B | IR-1 | 840 | 115 | 15 | 10 |
| Example 3 | C | IR-1 | 840 | 125 | 10 | 5 |
| Example 4 | D | IR-1 | 840 | 120 | 10 | 5 |
| Example 5 | E | IR-1 | 840 | 120 | 5 | 5 |
| Example 6 | A | IR-2 | 1064 | 120 | 5 | 5 |
| Example 7 | B | IR-2 | 1064 | 125 | 10 | 15 |
| Example 8 | C | IR-2 | 1064 | 120 | 15 | 10 |
| Example 9 | D | IR-2 | 1064 | 125 | 10 | 10 |
| Example 10 | E | IR-2 | 1064 | 125 | 0 | 5 |
| Example 11 | A | IR-1 | 840 | 120 | 5 | 5 |
| Example 12 | A | IR-2 | 1064 | 115 | 15 | 10 |
| Example 13 | E | IR-3 | 840 | 125 | 5 | 10 |
| Example 14 | E | IR-4 | 840 | 130 | 5 | 10 |
| Example 15 | E | IR-5 | 840 | 125 | 10 | 5 |
| Example 16 | E | IR-6 | 840 | 125 | 5 | 10 |
| Comparative example 1 | — | IR-1 | 840 | 140 | 30 | 40 |
| Comparative example 2 | Ethanolamine | IR-1 | 840 | No image formed | | |
| Comparative example 3 | Tri-n-butylamine | IR-1 | 840 | Slight image formed (film also formed in non-image areas) | | |
| Comparative example 4 | — | IR-2 | 1064 | 145 | 40 | 40 |
| Comparative example 5 | Ethanolamine | IR-2 | 1064 | No image formed | | |
| Comparative example 6 | Tri-n-butylamine | IR-2 | 1064 | Slight image formed (film also formed in non-image areas) | | |

The above-described results show that the planographic printing plates of Examples 1 to 16 have higher sensitivities to an infrared laser as compared with the planographic printing plates of Comparative Examples 1 to 6, and reveal extremely small differences in sensitivities when the above-described two level developing solutions are used showing that the planographic printing plates of Examples 1 to 16 have sufficient developing latitude for practical use.

Further, all of the planographic printing plates of Examples 1 to 16 have excellent storage stability to sufficiently satisfy the demands of practical use variation in the sensitivities before and after the storage is extremely small, as compared with the planographic printing plates of Comparative Examples 1 to 6.

Whereas, in Comparative Examples 2, 3, 5 and 6 using amine compounds which are not polyfunctional, satisfactory images could not be obtained or only faint image in which films remained in non-image areas were obtained.

The positive planographic printing material of the present invention can make a plate directly based on the digital data of a computer and the like using a solid laser or a semiconductor laser emitting infrared rays, has a high level of sensitivity to the above-described infrared lasers, and excellent in development latitude, and in addition, has excellent storage stability over a long period of time.

Accordingly, the positive planographic printing material of the present invention can be used as a printing plate for direct plate making which can be inscribed directly by an infrared laser.

What is claimed is:

1. A positive planographic printing material comprising the following components (A) to (C):

(A) a polyfunctional amine compound which is an adduct of a polyfunctional polymerizable monomer with an amine compound, (B) a polymer which is water-insoluble and aqueous alkali solution-soluble and (C) an infrared absorber.

2. A positive planographic printing material according to claim 1, wherein the number of functional groups in the polyfunctional amine compound (A) is from 2 to 10.

3. A positive planographic printing material according to claim 2, wherein the number of functional groups in the polyfunctional amine compound (A) is from 3 to 6.

4. A positive planographic printing material according to claim 1, wherein the polyfunctional amine compound (A) is a water-soluble compound.

5. A positive planographic printing material according to claim 1, wherein the polyfunctional amine compound (A) is a water-dispersible compound.

6. A positive planographic printing material according to claim 1, wherein the amine compound is ammonia or a primary or secondary amine having 2 to 12 carbon atoms.

7. A positive planographic printing material according to claim 1, wherein the amount of the polyfunctional amine compound (A) added to a photosensitive layer is in the range of from 3% by weight to 50% by weight based on the weight of the aqueous alkali solution-soluble polymer (B).

8. A positive planographic printing material according to claim 1, wherein the polymer which is water-insoluble and aqueous alkali solution-soluble (B) is a polymer selected from the group consisting of homopolymers containing an acidic group on the main chain and/or side chain thereof, copolymers thereof and mixtures thereof.

9. A positive planographic printing material according to claim 1, wherein the polymer which is water-insoluble and aqueous alkali solution-soluble (B) is a polymer containing on the main chain and/or side chain of the polymer at least one acidic group selected from the following groups (1) to (6):

(1) Phenol group (—Ar—OH)

(2) Sulfonamide group ($—SO_2NH—R$)

(3) Substituted sulfonamide type acidic group ($—SO_2NHCOR$, $—SO_2NHSO_2R$, $—CONHSO_2R$)

(4) Carboxyl group ($—CO_2H$)

(5) Sulfonic acid group ($—SO_3H$)

(6) Phosphoric acid group ($—OPO_3H_2$)

wherein, in the above-described groups (1) to (6), Ar represents a divalent aryl connecting group optionally having one or more substituents and R represents a hydrocarbon group optionally having one or more substituents.

10. A positive planographic printing material according to claim 9, wherein the polymer which is water-insoluble and aqueous alkali solution-soluble (B) is a polymer which is obtained by homo-polymerization or copolymerization of compounds containing at least one acidic group selected from the group consisting of the groups (1) to (6).

11. A positive planographic printing material according to claim 10, wherein the compounds containing at least one acidic group selected from the group consisting of (1) to (6) is contained in the aqueous alkali solution-soluble polymer (B) in an amount of 10 mol % or more.

12. A positive planographic printing material according to claim 10, wherein the compounds containing at least one acidic group selected from the group consisting (1) to (6) is contained in the aqueous alkali solution-soluble polymer (B) in an amount of 20 mol % or more.

13. A positive planographic printing material according to claim 10 comprising a polymer which is water-insoluble and aqueous alkali solution-soluble (B) wherein the compounding weight ratio of a minimum constituent unit derived from the compounds having an acidic group selected from the groups (1) to (6) constituting a part of the main chain and/or the side chain of the copolymer to the other minimum constituent unit not containing acidic group selected from the above-described groups (1) to (6) constituting a part of the main chain and/or the side chain is in the range of from 50:50 to 5:95.

14. A positive planographic printing material according to claim 1, wherein the polymer which is water-insoluble and aqueous alkali solution-soluble (B) is a homopolymer or copolymer having a weight-average molecular weight of $1.0\times10^3$ to $2.0\times10^5$ and a number-average molecular weight of $5.0\times10^2$ to $1.0\times10^5$.

15. A positive planographic printing material according to claim 1, wherein the polymer which is water-insoluble and aqueous alkali solution-soluble (B) has a dispersion degree of 1.1 to 10.

16. A positive planographic printing material according to claim 1, wherein the amount of the polymer which is water-insoluble and aqueous alkali solution-soluble (B) is in the range of from 30 to 99% by weight based on the total amount of solid components in materials constituting the photosensitive layer of the positive planographic printing material.

17. A positive planographic printing material according to claim 1, wherein the amount of the infrared absorber (C) is in the range of from 0.01 to 50% by weight based on the total amount of solid components in materials constituting the photosensitive layer of the positive planographic printing material.

18. A positive planographic printing material according to claim 1, wherein a photosensitive layer of the positive planographic printing material further comprises a dye and/or a pigment.

19. A positive planographic printing material according to claim 1, wherein a photosensitive layer of the positive planographic printing material further comprises at least one compound selected from the group consisting of onium salts, aromatic sulfone compounds, aromatic sulfonic ester compounds, cyclic acid anhydrides, phenols and organic acids.

20. A positive planographic printing material according to claim 1, wherein areas of the printing material exposed to irradiation become alkali-soluble due to a release by energy of a complex-complementary interaction caused by the components (A) to (C).

21. A positive planographic printing material according to claim 20, wherein the irradiation is an infrared ray.

* * * * *